(12) United States Patent
Tojo et al.

(10) Patent No.: US 8,975,732 B2
(45) Date of Patent: Mar. 10, 2015

(54) SEMICONDUCTOR DEVICE AND METHOD OF MANUFACTURING THE SAME

(71) Applicant: Kabushiki Kaisha Toshiba, Tokyo (JP)

(72) Inventors: Akira Tojo, Naka-gun (JP); Kazuhito Higuchi, Yokohama (JP); Tomohiro Iguchi, Kawasaki (JP); Masako Fukumitsu, Yokohama (JP); Daisuke Hiratsuka, Yokohama (JP); Akihiro Sasaki, Tokyo (JP); Masayuki Uchida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/799,218

(22) Filed: Mar. 13, 2013

(65) Prior Publication Data
US 2013/0241040 A1 Sep. 19, 2013

(30) Foreign Application Priority Data

Mar. 14, 2012 (JP) ................................. 2012-057781
Jan. 17, 2013 (JP) ................................. 2013-006553

(51) Int. Cl.
*H01L 23/495* (2006.01)
*H01L 21/50* (2006.01)
*H01L 23/051* (2006.01)
(Continued)

(52) U.S. Cl.
CPC ............ *H01L 23/4952* (2013.01); *H01L 21/50* (2013.01); *H01L 23/051* (2013.01);
(Continued)

(58) Field of Classification Search
CPC ....... H01L 24/20; H01L 24/97; H01L 23/051; H01L 23/5389
USPC ........................................................... 257/666
See application file for complete search history.

(56) References Cited

U.S. PATENT DOCUMENTS 8,309,434 B2 * 11/2012 Asai et al. ...................... 438/462
8,446,003 B2 * 5/2013 Komura et al. ................ 257/700
2006/0060891 A1 3/2006 Pavier

FOREIGN PATENT DOCUMENTS

DE 10 2006 021 959 A1 11/2007
DE 10 2008 057 707 A1 6/2009
(Continued)

OTHER PUBLICATIONS

Office Action issued Jun. 10, 2013, in German Patent Application No. 10 2013 204 344.9 (with English-language translation).

*Primary Examiner* — Michael Trinh
*Assistant Examiner* — Toniae Thomas
(74) *Attorney, Agent, or Firm* — Oblon, McClelland, Maier & Neustadt, L.L.P.

(57) ABSTRACT

According to one embodiment, a semiconductor device includes, a chip including a first chip electrode on a first surface on one side, and a second chip electrode on a second surface on the other side, an electrically conductive frame provided on a side periphery of the chip, a rewiring configured to electrically connect the second chip electrode and the electrically conductive frame on the other side of the chip, and an insulation side portion provided between the electrically conductive frame and the side periphery of the chip.

12 Claims, 22 Drawing Sheets

(51) Int. Cl.
*H01L 23/498* (2006.01)
*H01L 23/538* (2006.01)
*H01L 23/00* (2006.01)

(52) U.S. Cl.
CPC ...... *H01L 23/49844* (2013.01); *H01L 23/5389* (2013.01); *H01L 24/97* (2013.01); *H01L 24/19* (2013.01); *H01L 24/20* (2013.01); *H01L 2924/13055* (2013.01); *H01L 2224/45124* (2013.01); *H01L 2924/00014* (2013.01)

USPC .......................................................... 257/666

(56) References Cited

FOREIGN PATENT DOCUMENTS

| | | |
|---|---|---|
| DE | 10 2010 017 768 A1 | 2/2011 |
| DE | 102013204344 A1 * | 9/2013 |
| JP | 2006-514785 | 5/2006 |

* cited by examiner

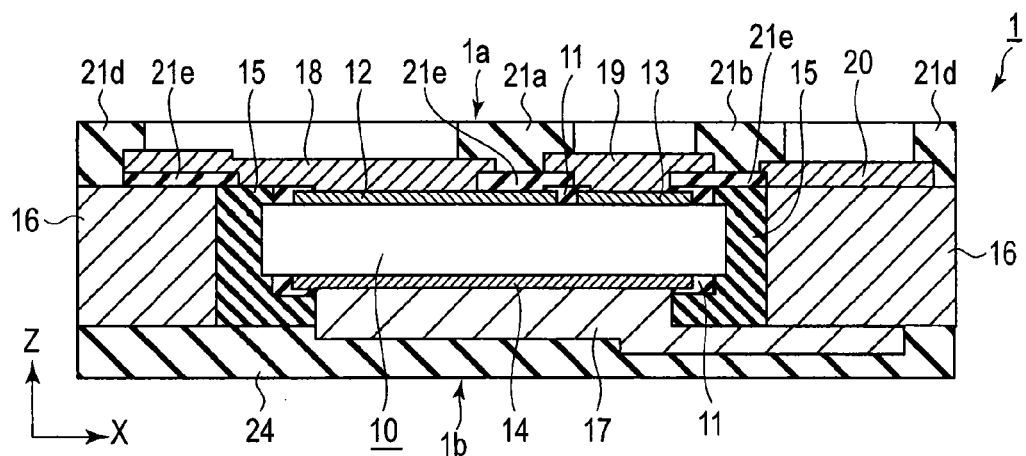
F I G. 1
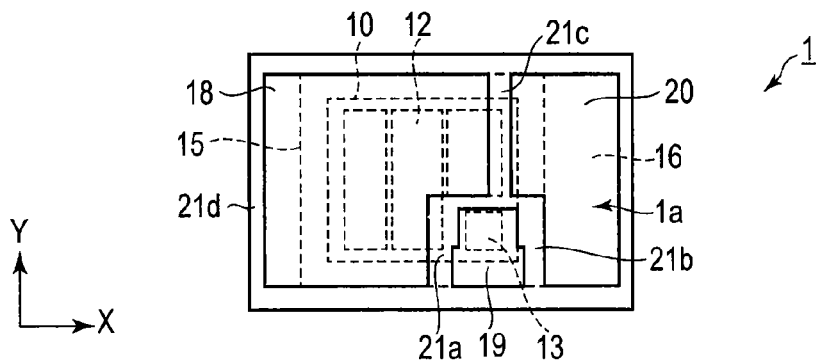
F I G. 2
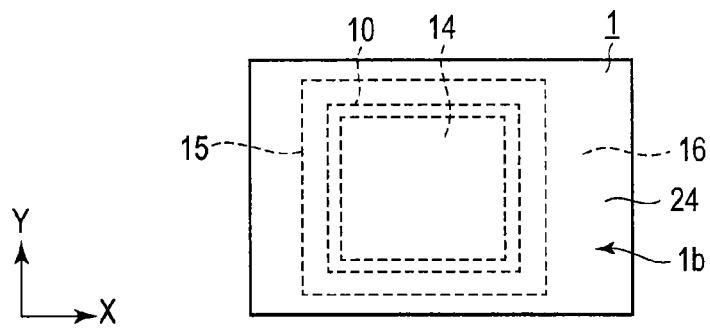
F I G. 3

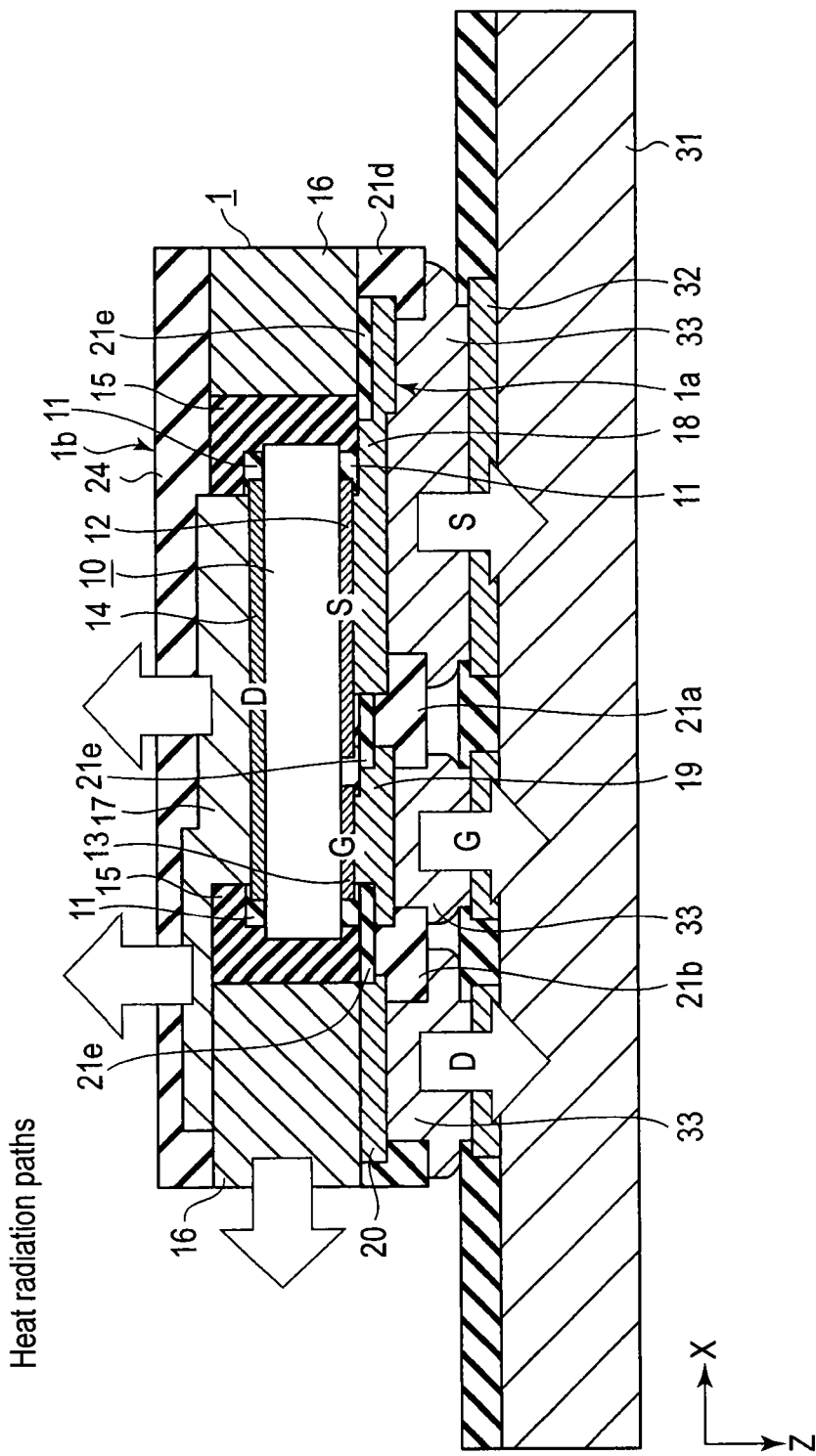
F I G. 8

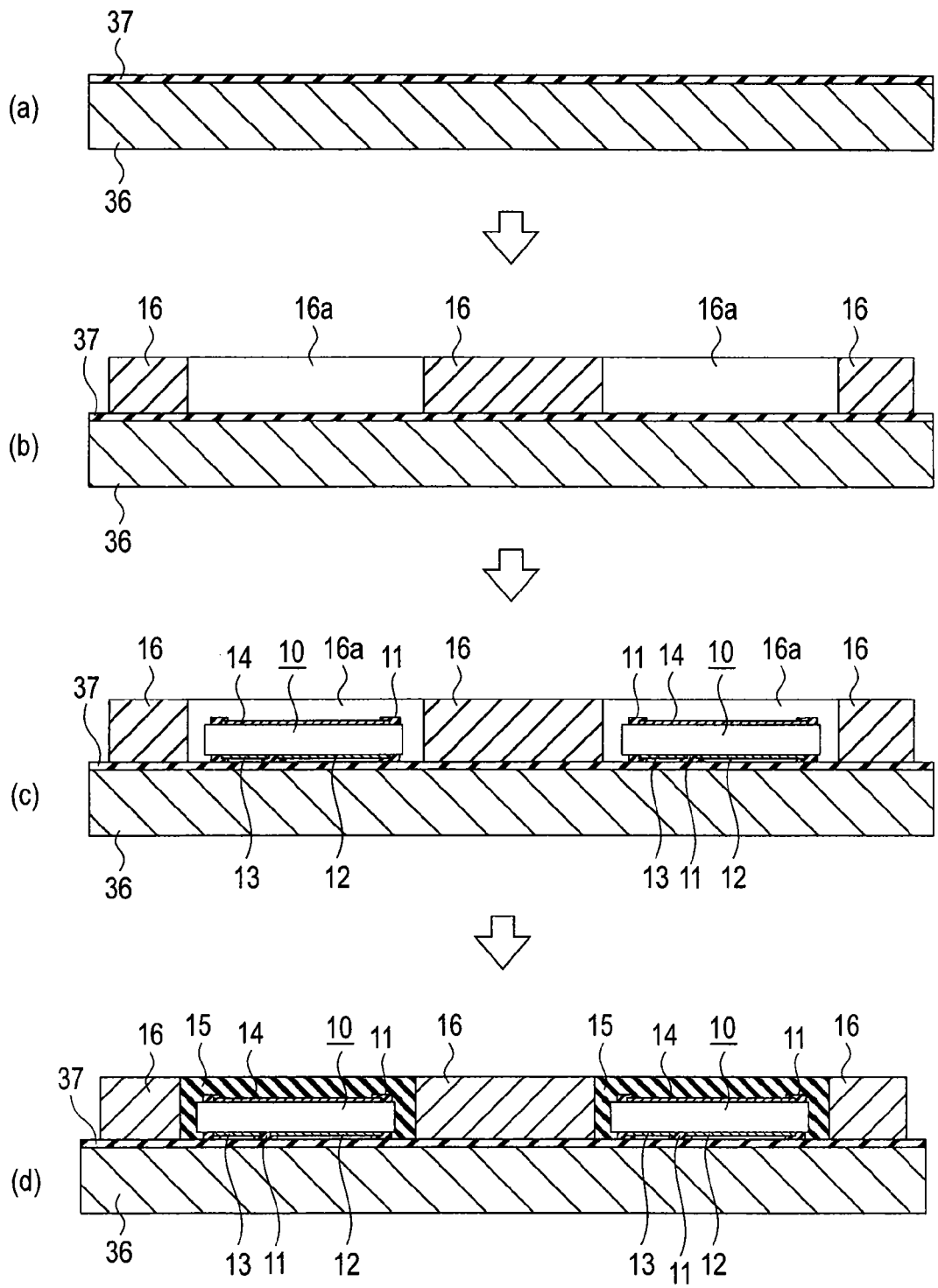
F I G. 9A

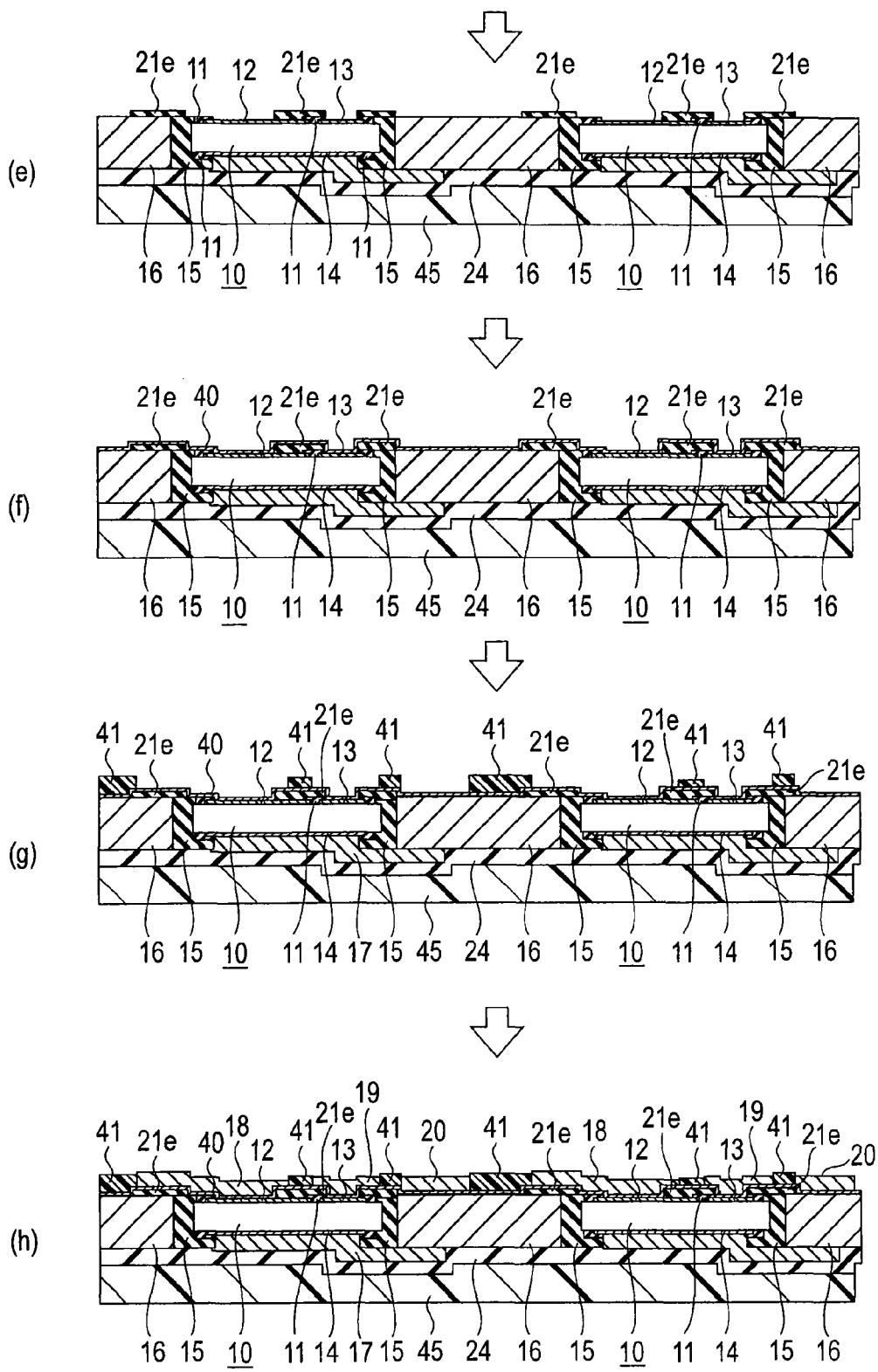
F I G. 10 B

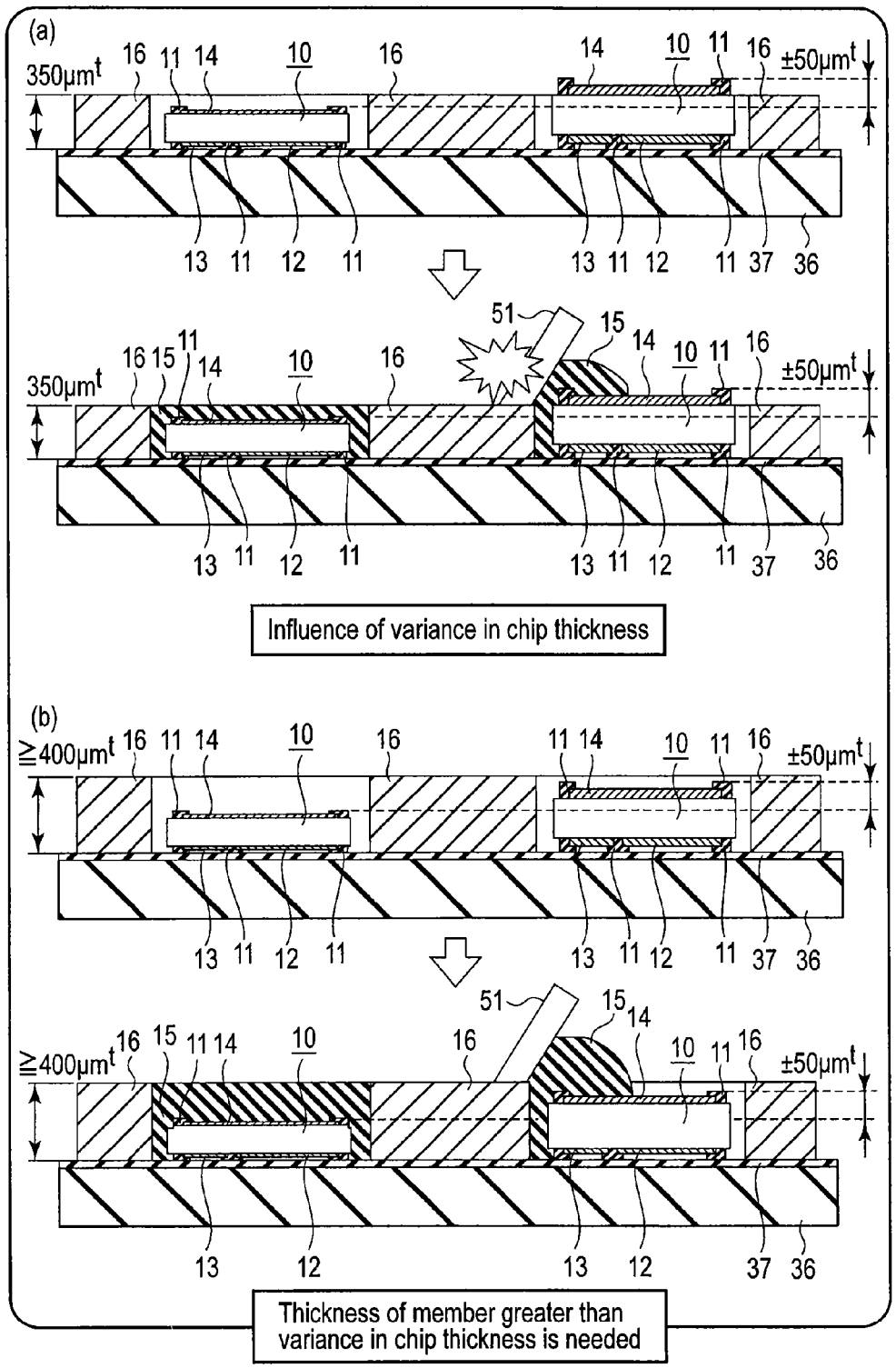
F I G. 12

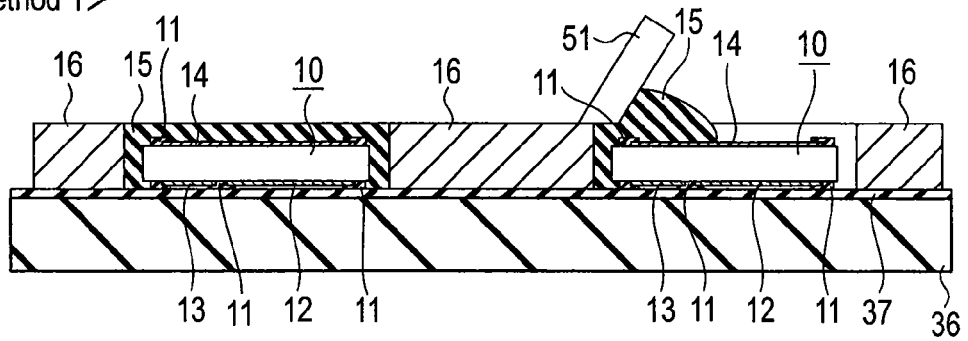
F I G. 1 3 A
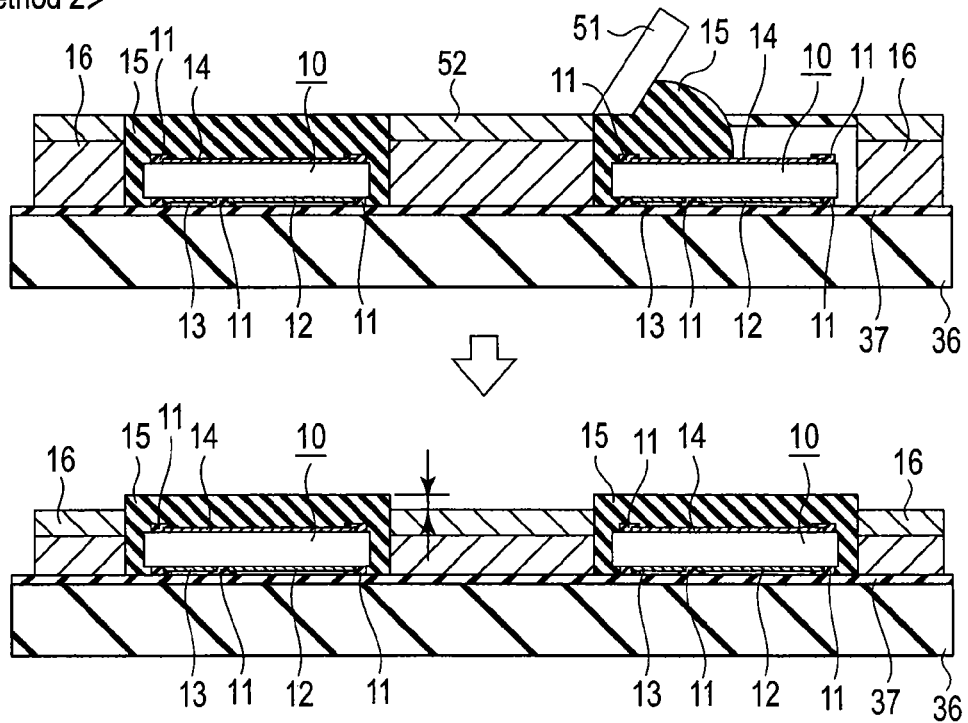
F I G. 1 3 B

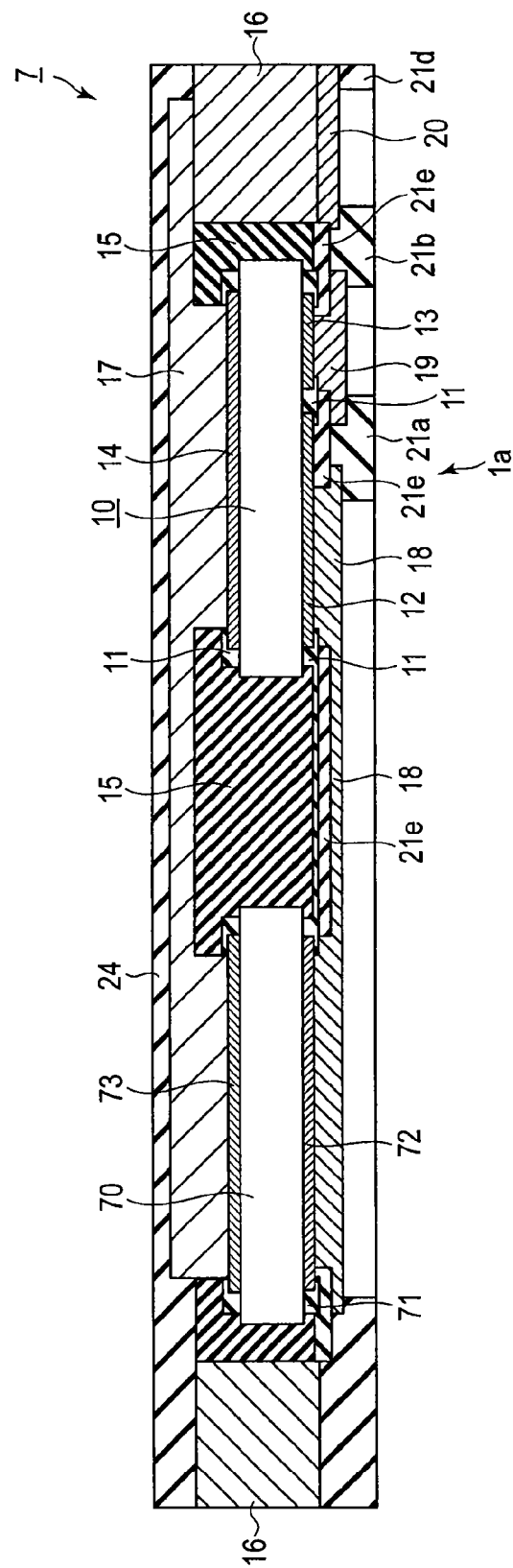
F I G. 22

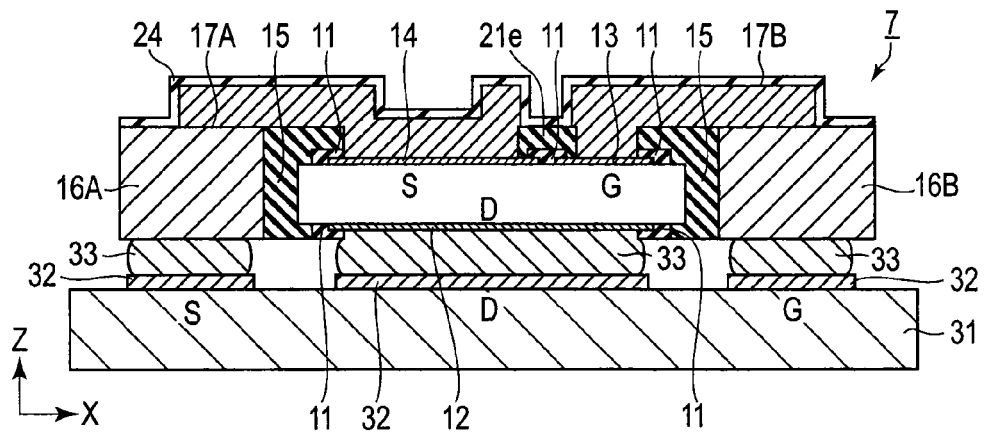
F I G. 2 3
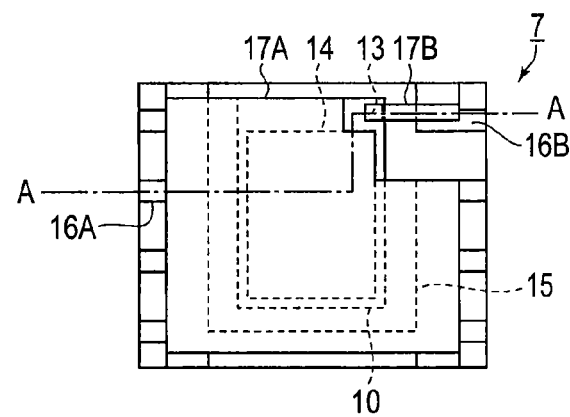
F I G. 2 4
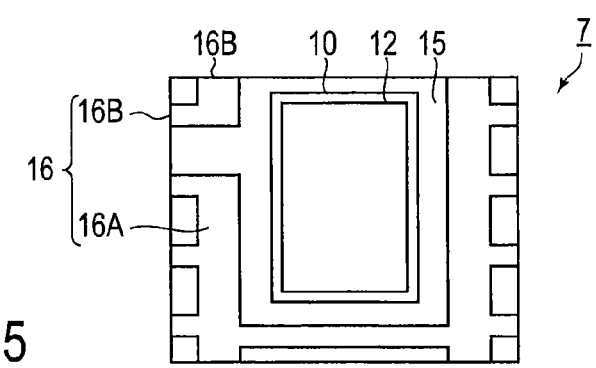
F I G. 2 5

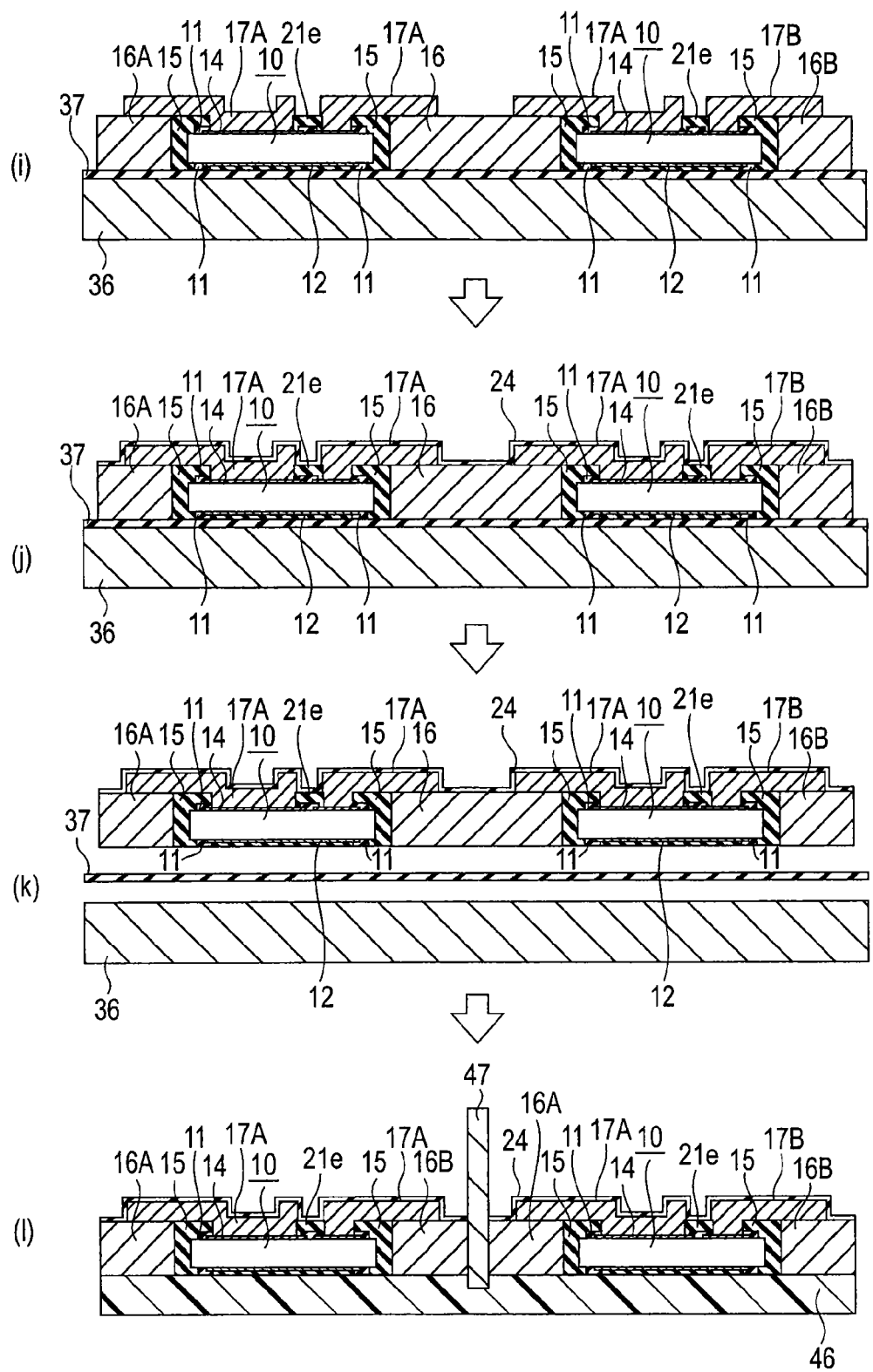
F I G. 2 8

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Applications No. 2012-057781, filed Mar. 14, 2012; and No. 2013-006553, filed Jan. 17, 2013, the entire contents of all of which are incorporated herein by reference.

FIELD

Embodiments described herein relate generally to a semiconductor device and a method of manufacturing the semiconductor device.

BACKGROUND

In the field of semiconductor chips and power modules, there are used power semiconductor devices such as a multipin IGBT (Insulated Gate Bipolar Transistor) having electrodes called a gate (G), a source (S) and a drain (D) on front and back sides of the semiconductor chip, and a 2-pin diode having a rectification function and having electrodes on front and back sides thereof.

A TO (Transistor Outline) and an SIP (Single Inline Package), in which power semiconductor chips such as IGBTs are packaged, diodes, and power modules, in which these semiconductor chips are sealed, are applied to many products, for instance, DC-DC converters for consumer equipment, inverters for vehicles and air conditioners, transportation means such as electric trains and bullet trains, and electric power transmission/distribution. The range of applications and the market size are increasing.

In general, an insertion-type power transistor such as a TO or SIP, which has been marketed, is a package which is configured such that a semiconductor chip is mounted on a lead frame, wire bonding is performed from electrodes on the chip surface to other lead frames, and the chip is resin-sealed. In addition, in a power module, a plurality of IGBTs and diodes are COB (Chip On Board) mounted, and after wire bonding, the IGBTs and diodes are sealed with a gel sealing material for insulation and protection. In general, in the power module with this structure, a mount board (a wiring pattern is formed of a metallic material such as Cu on a ceramic board) is disposed in the housing. IGBT chips and diode chips are connected by die-mounting to predetermined pattern locations on the mount board by using a bonding material such as solder, and wiring connections are made by wire bonding of, typically, Al.

BRIEF DESCRIPTION OF THE DRAWINGS

FIG. 1 is a cross-sectional view of a semiconductor package according to a first embodiment.
FIG. 2 is a plan view of the semiconductor package.
FIG. 3 is a bottom view of the semiconductor package.
FIG. 8 is an explanatory view illustrating a heat radiation path in the board mount state of the semiconductor package.
FIG. 9A is an explanatory view illustrating an assembly process of the semiconductor package.
FIG. 10B is an explanatory view illustrating the assembly process of the semiconductor package.
FIG. 12 is an explanatory view illustrating a thickness condition of an electrically conductive frame of the semiconductor package.
FIG. 13A is a detailed explanatory view of a resin seal step in the assembly process of the semiconductor package.
FIG. 13B is a detailed explanatory view of a resin seal step in the assembly process of the semiconductor package.
FIG. 22 is a side view of a semiconductor package according to another embodiment.
FIG. 23 is a cross-sectional view illustrating a board mount state of a semiconductor package according to a fifth embodiment.
FIG. 24 is a plan view of the semiconductor package.
FIG. 25 is a bottom view of the semiconductor package.
FIG. 28 is an explanatory view illustrating the manufacturing method of the semiconductor package.

DETAILED DESCRIPTION

Figure 4:
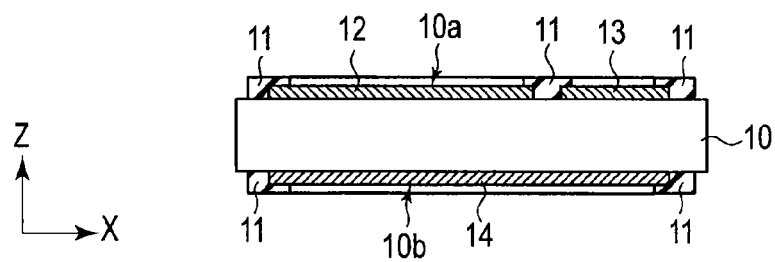
FIG. 4 is a cross-sectional view of a semiconductor chip in the semiconductor package.

In general, according to one embodiment, a semiconductor device comprises, a chip including a first chip electrode on a first surface on one side, and a second chip electrode on a second surface on the other side, an electrically conductive frame provided on a side periphery of the chip, a rewiring configured to electrically connect the second chip electrode and the electrically conductive frame on the other side of the chip, and an insulation side portion provided between the electrically conductive frame and the side periphery of the chip.

First Embodiment

Referring now to FIG. 1 to FIG. 13, a description is given of a semiconductor package (semiconductor device) 1 according to an embodiment and a manufacturing method thereof. The respective Figures schematically show structures by enlarging, reducing or omitting them, where necessary.

FIG. 1 is a cross-sectional view schematically illustrating the semiconductor package 1 according to the present embodiment. FIG. 2 is a plan view schematically illustrating the semiconductor package. FIG. 3 is a bottom view schematically illustrating the semiconductor package. The semiconductor package 1 includes a semiconductor chip 10 having electrodes on both sides thereof; an electrically conductive frame 16 surrounding the semiconductor chip 10; an insulation side portion 15 provided between the semiconductor chip 10 and the conductive frame 16; a rewiring 17 formed by soldering on a back surface side of the semiconductor chip 10; a plurality of rewiring electrodes 18, 19 and 20 which are formed by soldering on a front surface side of the semiconductor chip 10 and constitute external electrodes; electrode insulation portions 21a to 21e which mutually insulate, on the front surface side of the semiconductor chip 10, chip electrodes 12 and 13, conductive frame 16 and rewiring electrodes 18, 19 and 20; and an insulation film 24 covering the back surface side of the semiconductor package 1.

Figure 5:
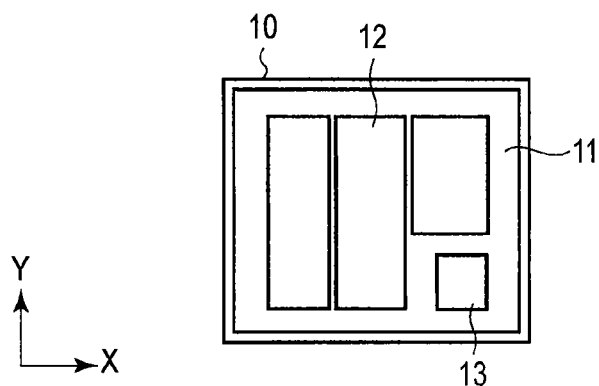
FIG. 5 is a plan view of the semiconductor chip.
Figure 6:
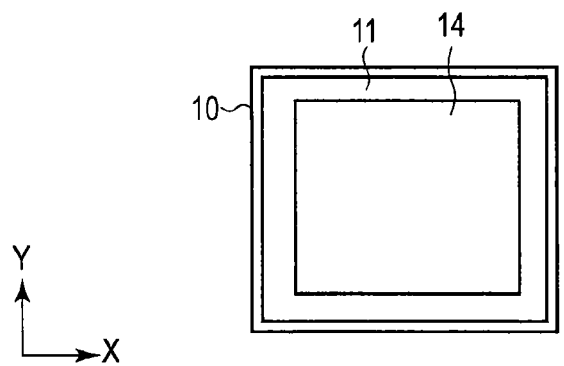
FIG. 6 is a bottom view of the semiconductor chip.

The semiconductor chip 10 shown in FIG. 4 to FIG. 6 is, for example, an IGBT semiconductor chip 10, which includes at least three electrodes 12, 13 and 14 and insulation portions 11 which insulate the electrodes 12, 13 and 14. In this example, a gate (G) and a source (S) are provided on a front surface side of the semiconductor chip 10, as shown in FIG. 5, and a drain (D) is provided on a back surface side of the semiconductor chip 10, as shown in FIG. 6. In this embodiment, a simplified system, in which electrodes necessary for a temperature monitor function and voltage monitor function are omitted, is illustrated. In this embodiment, the source electrode on the front surface is the first chip electrode 12, the drain electrode on the back surface is the second chip electrode 14, and the gate electrode on the front surface is the third chip electrode 13.

The conductive frame 16 is formed of an electrically conductive material such as Cu. The conductive frame 16 is in contact with the outside of the insulation side portion 15 which covers the side surfaces of the semiconductor chip 10, and the conductive frame 16 surrounds the outer periphery of the insulation side portion 15. In a manufacturing process which will be described later, a conductive frame 16 having a plurality of rectangular openings 16a is used, semiconductor chips 10 are disposed in the respective openings 16a, and the semiconductor chips 10 are packaged and then singulated. In the structure of a single semiconductor package 1, the conductive frame 16 is formed in a rectangular frame shape, with one rectangular opening 16a being formed at the center of the conductive frame 16.

In the meantime, the difference between the outside dimensions of the semiconductor chip 10 and the inside dimensions of the opening is set in consideration of a tolerance in which processing precision is taken into account, as well as the mounting precision of the semiconductor chip 10. For example, this difference is set at about 50 μm on one side. Accordingly, it is possible to provide, where necessary, an adequate distance (resin thickness) in relation to a withstand voltage of a general insulation material.

As illustrated in FIG. 12, if practical use of SiC, which is a future technology, in the semiconductor chip 10 is considered, it is assumed that there is a thickness variance of about ±50 μmt relative to a target thickness, since SiC is a material that is difficult to grind. Thus, the thickness is set so as to implement an assembly process and a package structure which can flexibly adapt to the thickness variance. In this example, in consideration of the assumed variance ±50 μmt in thickness of the semiconductor chip 10, use is made of the conductive frame 16 with a thickness greater than at least the thickness of the semiconductor chip 10 including a variance. For example, as illustrated in part (a) of FIG. 12, when the conductive frame 16 is thinner than the chip 10, a hindrance occurs in a later step when an insulation material is planarized by a squeegee 51 at the same level as the upper surface of the conductive frame 16. On the other hand, by using a thickness in which a thickness variance is taken into account, the thickness variance of the chip 10 can be canceled, and it is possible to flexibly adapt to the thickness variance. In the meantime, by virtue of the improvement of grinding technology in recent SiC chip development, it has become possible to reduce a chip thickness variance. However, from the standpoint of thickness precision of the conductive frame 16, it is necessary to make the maximum value of the thickness variance of the chip smaller than the minimum value of the thickness variance of the frame.

The insulation side portion 15 shown in FIG. 1 and FIG. 3 is formed by sealing with an insulation resin between the conductive frame 16 and the side wall of the semiconductor chip 10, and the insulation side portion 15 effects electrical insulation between the conductive frame 16 and the semiconductor chip 10. Specifically, the insulation side portion 15 covers, with the insulation material, the entire periphery of the side surfaces of the semiconductor chip 10.

In the structure of the embodiment, heat radiation can be effected through conduction paths of metallic material extending from the chip electrodes 12 to 14 of the semiconductor chip 10 to the rewiring 17, conductive frame 16 and rewiring electrodes 18 to 20. Thus, the insulation material, which is formed on the side surfaces of the semiconductor chip 10, does not need to have a high heat conductivity. Accordingly, the insulation material can be selected from among generally mass-produced insulation resins. Examples, which are applicable, include PW-1500T (breakdown voltage: 420 kV/mm) manufactured by TORAY Industries, Inc., CRC-8350 (breakdown voltage: 250 kV/mm) manufactured by Sumitomo Bakelite Co., Ltd., KS6600-7F (breakdown voltage: 440 kV/mm) manufactured by Hitachi Chemical Company, Ltd., and Pyromax HR-16NN (breakdown voltage: 300 kV/mm) manufactured by TOYOBO Co., Ltd. In the case of these insulation resins, if the thickness is about 20 μmt, the withstand voltage, which is required for the semiconductor package 1, can be satisfied. As described above, in the semiconductor package 1, since the space of about 50 μm is present on the side surface of the semiconductor chip 10, if this space is sealed with the insulation resin, an adequate thickness for the necessary withstand voltage can be obtained. In addition, where necessary, it is possible to apply an already manufactured epoxy sealing material for power packages or a next-generation sealing resin which has been examined as being adaptive to SiC. When a particularly high rigidity is necessary for a package, there is a case in which an epoxy-based high-elasticity material is needed, rather than the above-described low-elasticity material.

The rewiring 17 is formed of, e.g. a Cu plating film, and is formed at predetermined locations on the surface of the back side (other side) of the second chip electrode 14 on the back surface of the semiconductor chip 10, and on the surface of the back side (other side) of the insulation side portion 15. The second chip electrode 14 on the back surface of the semiconductor chip 10 and the conductive frame 16, which is disposed on the side surface of the semiconductor chip 10, are mechanically and electrically connected via the rewiring 17.

The rewiring electrodes 18, 19 and 20, which constitute first to third external electrodes, are disposed in the same plane on the front surface side of the semiconductor package 1. The rewiring electrodes 18, 19 and 20, like the rewiring 17, are formed of, e.g. Cu plating films. As shown in FIG. 1 and FIG. 2, in this example, the first rewiring electrode 18 is formed of a plating film which is formed on a predetermined area including an area above the first chip electrode 12 on the front side of the semiconductor chip 10, an area above the insulation side portion 15, and an area above the electrode insulation portion 21e on the conductive frame 16. However, in the case where the electrode insulation portion 21e completely covers the insulation side portion 15, the first rewiring electrode 18 is formed on only the electrode insulation portion 21e and the first chip electrode 12. The first rewiring electrode 18 is formed on a broader area than the first chip electrode 12, is connected to the first chip electrode 12, and functions as the external electrode of the source electrode.

The second rewiring electrode 20 is formed of a plating film which is formed on a predetermined area including an area above a one-side surface of the conductive frame 16 which is disposed on the side portions of the semiconductor chip 10, an area above the insulation portion 11 on the surface of the semiconductor chip 10, and an area above the electrode insulation portion 21e. The second rewiring electrode 20 is disposed in juxtaposition to, and in the same plane as, the first rewiring electrode 18, is connected to the second chip electrode 14 via the conductive frame 16 and rewiring 17, and functions as the external electrode of the drain electrode.

The third rewiring electrode 19 is formed of a plating film which is formed on a predetermined area including an area above the third chip electrode 13 on the surface of the semiconductor chip 10, an area above the insulation portion 11 on the surface of the semiconductor chip 10, an area above the electrode insulation portion 21e. The third rewiring electrode 19 is not in contact with the first chip electrode 12, and is insulated. The third rewiring electrode 19 is formed on a broader area than the third chip electrode 13, is connected to the third chip electrode 13, and functions as the external electrode of the gate electrode.

In the meantime, Cu plating films, which are formed as the rewiring 17 and rewiring electrodes 18, 19 and 20, are formed via seed layers 40 (adhesive layers) of, typically, Ti/Cu, in order to enhance the adhesivity of the Cu plating films, and are formed have a two-layer structure.

As shown in FIG. 2, electrode insulation portions 21 include insulation portions 21a, 21b and 21c which are formed between the plural rewiring electrodes 18, 19 and 20 formed on a first surface side, and an insulation portion 21d which is formed around the rewiring electrodes 18, 19 and 20.

The electrode insulation portions 21a to 21d are formed of, for example, the same insulation resin as the insulation side portion 15. However, when an epoxy resin including a filler is used for the insulation side portion 15, a filler-less insulation resin such as solder resist is applied.

The rewiring electrodes 18, 19 and 20 are insulated from each other by the insulation portions 21a, 21b and 21c. The insulation portions 21a, 21b, 21c and 21d on the surface also function to adjust the wettability and spread of solder at a time of mounting on the board.

In addition, as the electrode insulation portion 21, an electrode insulation portion 21e is formed for insulating locations at which the conductive frame 16, external electrode 20, chip electrode 12 and chip electrode 13 interfere with each other. The electrode insulation portion 21e is formed of an insulation film in which only contact portions of the electrode portions 12 and 13 on the front surface of the chip 10 and conductive frame 16 are opened.

When the rewiring electrodes 18 and 19 are formed by plating at the parts of the first chip electrode 12 and third chip electrode 13 of the semiconductor chip 10, the electrode insulation portion 21e serves to ensure insulation from the conductive frame 16, and at the same time serves to ensure insulation of locations at which the external electrode 20 interferes with the chip electrode 12. The electrode insulation portion 21e is made by forming a film of an insulation resin on a predetermined area by PEP or printing. As the material of the electrode insulation portion 21e, various insulation resins can be used, like the above-described insulation side portion 15, and the insulation resin is patterned according to the design of the semiconductor package.

The insulation film 24 shown in FIG. 1 and FIG. 3 is formed by sealing, with an insulation resin film, the entirety of the back surface (the other side surface) of the semiconductor package 1. As the material of the insulation film 24, various insulation resins can be selected, like the above-described insulation side portion 15. This insulation film 24 realizes prevention of variation in electrical characteristics due to oxidation of the rewiring 17, an improvement of the external appearance, planarization of stepped portions on the rewiring, and marking of a product number, etc.

On the front side (upper side in FIG. 1) of the semiconductor chip 10, the electrode surfaces of the chip electrodes 12 and 13, the surface of the insulation side portion 15 and the surface of the conductive frame 16 are configured to exist in the same plane. On the back side (lower side in FIG. 1) of the semiconductor chip 10, since the variance in thickness of the semiconductor chip 10 is canceled by the conductive frame 16, the electrode surface of the chip electrode 14, the surface of the insulation side portion 15 and the surface of the conductive frame 16 are not in the same plane.

The semiconductor package 1 with the above-described structure is configured such that the semiconductor chip 10 having the electrodes on the front side 1a and back side 1b is provided as a target and the external electrodes of the semiconductor package 1 can be aggregated, or put together, one one side. Thus, this semiconductor package 1 is configured as a surface mount type (one-side mount structure) semiconductor package 1, which can be connected to a mount board 31 via the external electrodes which are put together on the front side 1a of the semiconductor package 1, or one side of the semiconductor package 1, and can be mounted on the board by the same connection method as with surface mount components by using various electrically conductive connection members 33 such as solders or conductive pastes.

Figure 7:
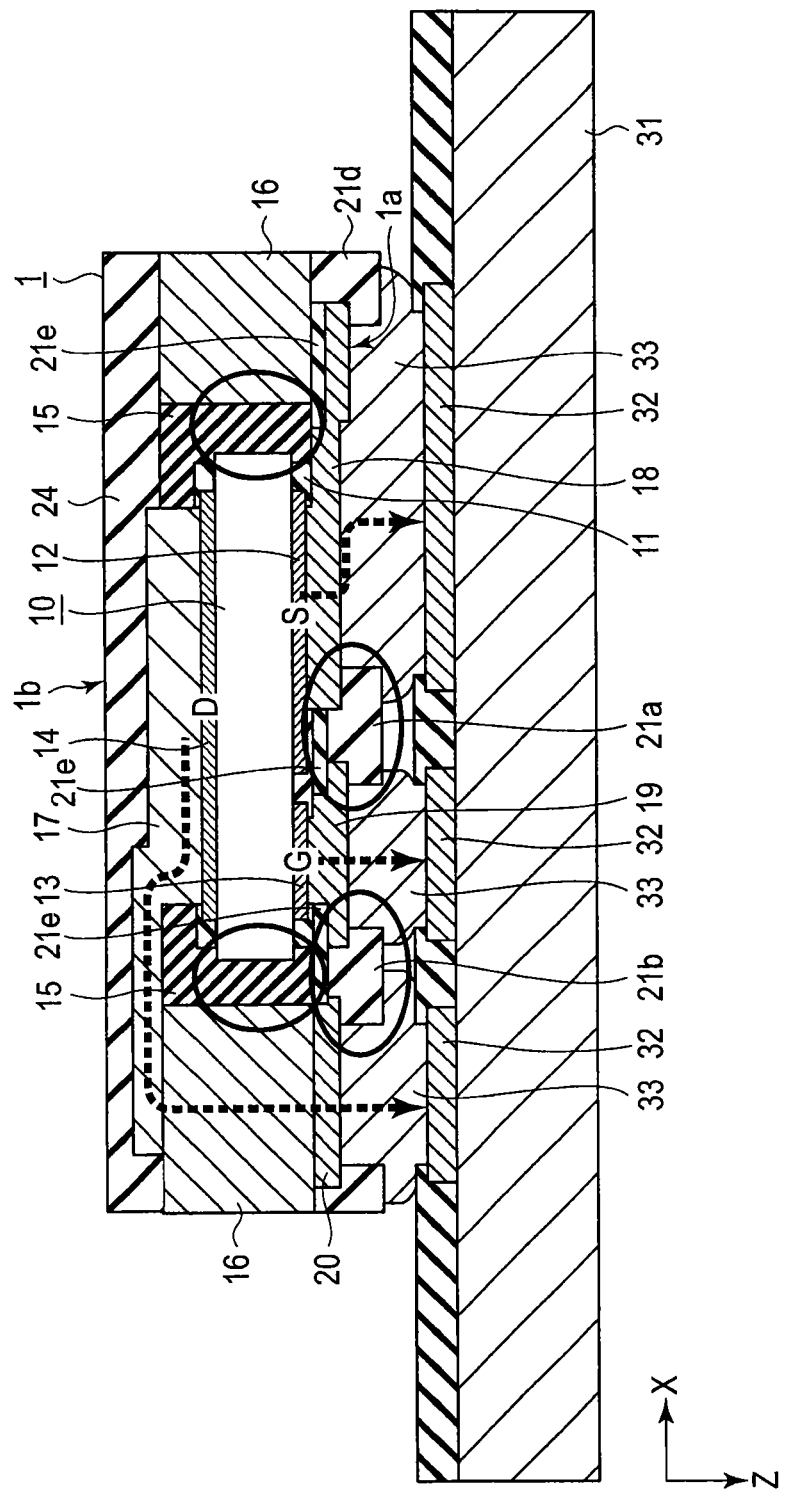
FIG. 7 is an explanatory view illustrating a flow of current in a board mount state of the semiconductor package.

FIG. 7 and FIG. 8 are schematic cross-sectional views illustrating a state after the semiconductor package 1 is mounted on the board. FIG. 7 illustrates current conduction paths between the mount board 31 and the semiconductor package 1, and FIG. 8 illustrates heat radiation paths. The directions of arrows in FIG. 7 have no relation to the direction of electric current.

As illustrated in FIG. 7, an electric conduction path of the second chip electrode 14 (drain) is formed in a horizontal direction (X direction) by the rewiring 17 formed on the electrode surface of the second chip electrode 14 (drain), and is formed in a vertical direction (Z direction) by the conductive frame 16 disposed on the side surface of the semiconductor chip 10. The second chip electrode 14 (drain) is electrically connected to the board via a connection member 33 such as solder.

In addition, the first chip electrode 12 (source) and third chip electrode 13 (gate) are electrically connected to board electrodes 32 of the mount board 31 via the rewiring electrodes 18 and 19 and connection materials 33 such as solder.

As illustrated in FIG. 8, the current conduction paths shown in FIG. 7 can be used as heat radiation paths for radiating heat of the semiconductor chip 10 to the outside. In addition, heat can be radiated in the lateral direction of the semiconductor package 1 from the conductive frame 16 on the lateral side of the semiconductor chip 10. Besides, heat can be radiated from the rewiring 17 on the back side (the upper side in FIG. 8) of the semiconductor package 1. If the insulation film 24 on the semiconductor package 1 is omitted, the heat radiation capability can be enhanced. In this manner, since the insulation materials (layers) exist in a perpendicular direction in relation to the radiation paths of the semiconductor package 1 and there are few structural parts which prevent heat radiation, the insulation materials do not need to have a high heat conductivity and it is possible to select materials by paying attention to a high withstand voltage.

Next, a method of manufacturing the semiconductor package 1 according to the embodiment is described with reference to FIG. 9 to FIG. 13. FIG. 9 to FIG. 11 successively illustrate an assembly process. In this assembly process, fan-out for electrodes of a singulated semiconductor chip 10 is implemented with rewiring by plating, thereby extending wiring from the back surface side of the semiconductor chip 10 toward the front surface side of the semiconductor chip 10, and putting together external electrodes on one side of the semiconductor package 1. In the process illustrated, after a plurality of semiconductor packages 1 are formed at a time, the semiconductor packages 1 are singulated.

To start with, as illustrated in part (a) of FIG. 9A, a provisional fixing material 37, which is re-peelable, is disposed on a substrate 36. A double-coated adhesive sheet or an adhesive, which is re-peelable, is used as the provisional fixing material 37. For example, in the case of a re-peelable double-coated adhesive sheet, the double-coated adhesive sheet is laminated. In the case of an adhesive, the adhesive is formed by coating by means of a spin coater, or by printing by mean of a screen printer.

For example, various adhesives are applicable, such as a heat foaming peel type, a UV irradiation foaming peel type, a temperature-sensitive type with an adhesive strength which extremely lowers, or a type which is peelable by dissolution in a solvent or hot water. In the case of the heat foaming peel type or temperature-sensitive type, the heat resistance of a sheet is taken into account at a time of forming an insulation material which is carried out in a preceding step, or a sputter process.

The necessary adhesive strength varies depending on, for example, dimensions of the semiconductor chip 10. For example, the necessary adhesive strength is set such that no positional displacement may occur when the wafer is conveyed after re-disposition of the semiconductor chip 10, or when the semiconductor chip 10 is resin-sealed. For example, it is preferable that the adhesive strength be set at 2N/25 mm or more. However, depending on the outside dimensions of the chip, the adhesive strength is not limited to this value.

For example, a SUS plate or a glass wafer is used for the substrate 36. The material of the substrate 36 is selected in accordance with characteristics of the provisional fixing material 37. For example, if the provisional fixing material 37 is the UV sensitive type, a glass wafer which passes necessary UV light is desirable.

Then, as shown in part (b) of FIG. 9A, an electrically conductive frame 16 is disposed and fixed on the provisional fixing material 37. In this step, use is made of an electrically conductive frame 16 of, e.g. Cu material, in which a plurality of rectangular chip mount areas are opened.

Subsequently, as illustrated in part (c) of FIG. 9A, semiconductor chips 10 are disposed in openings 16a of the conductive frame 16. In this step, the semiconductor chips 10, which have been singulated from the wafer, are re-disposed with the pitch thereof increased, and are provisionally fixed on the provisional fixing material 37 such as an already laminated adhesive sheet.

Since the electrode dimensions of each semiconductor chip 10 are large, a very high mount precision is not needed. However, taking subsequent fabrication steps into account, the semiconductor chips 10 are re-disposed at central parts of the openings 16a formed in the conductive frame 16. At this time, since the conductive frame 16 and semiconductor chips 10 are mounted on the provisional fixing material 37 on the substrate 36, the surfaces of both the conductive frame 16 and semiconductor chips 10, which are in contact with the double-coated sheet, will exist in the same plane when the fabrication of the semiconductor package 1 is completed.

Although the shape of the conductive frame 16 depends on the device specifications in subsequent fabrication steps, for example, the conductive frame 16 with a rectangular shape or a wafer shape (circular shape) is used. In this example, since a plurality of semiconductor packages 1 are fabricated at a time, the conductive frame 16, in which a plurality of openings 16a are formed with a predetermined pitch, is used. Although the pitch of the openings 16a is varied in accordance with the package design, this pitch is set to be a distance including a street width for dicing in a subsequent step.

Then, as illustrated in part (d) of FIG. 9A, an insulation material is filled, and the semiconductor chips 10 are sealed. Specifically, the side surfaces and front surfaces of the re-disposed semiconductor chips 10 are sealed with insulation resin. As regards the sealing methods, resin sealing can be performed by methods such as screen printing, vacuum printing, spin coat, and spin coat after dispense. In this step, the outer peripheral part on the side surface of each semiconductor chip 10 is completely sealed with the insulation resin. In this manner, since the insulation resin is coated and formed on the provisional fixing material 37 which is adhered to the substrate 36, the surface of each semiconductor chip 10, which is in contact with the provisional fixing material 37, the surface of the insulation resin which forms the insulation side portion 15, and the surface of the conductive frame 16 exist in the same plane.

Figure 9B:
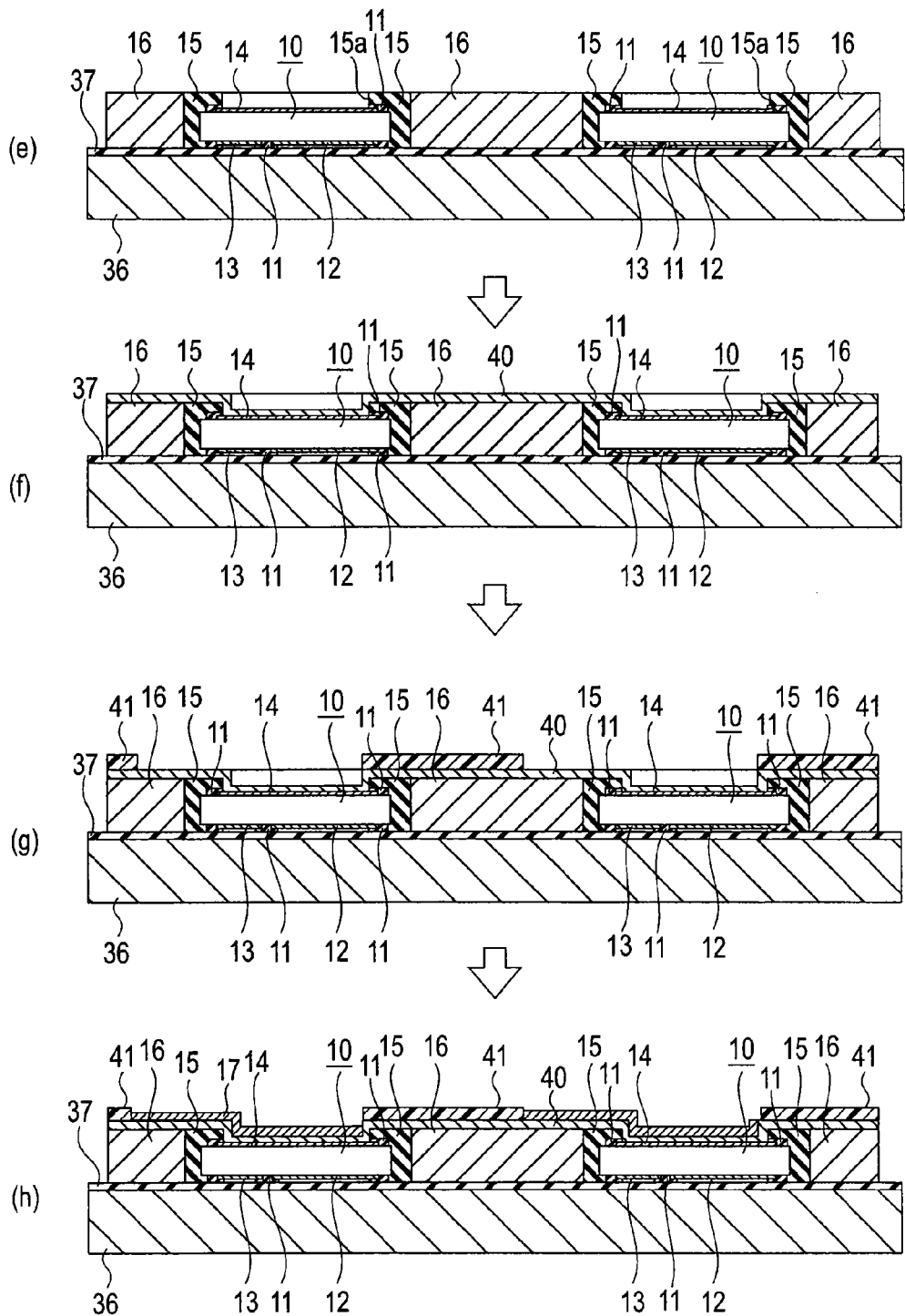
FIG. 9B is an explanatory view illustrating the assembly process of the semiconductor package.

Next, as illustrated in part (e) of FIG. 9B, openings are formed in the insulation sealing material, and chip electrodes 14 are exposed. In this step, the insulation resin is removed by patterning by PEP (mask exposure/development/cure) on the photosensitive insulation material, or by laser processing, and the back-side electrode (source electrode) 14 of each semiconductor chip 10 is exposed. In addition, openings can be formed by patterning printing with a metal mask at a time of resin printing. By the above fabrication steps, the opening 15a of a predetermined shape, which covers the periphery of each semiconductor chip 10 and exposes the chip electrode, is formed, and the insulation side portion 15 is formed.

In the opening-formation step illustrated in part (e) of FIG. 9B, when the opening 15a is formed by laser processing or printing and the chip electrode is exposed, complete heat curing of the resin material is performed in the sealing step illustrated in part (d) of FIG. 9A. On the other hand, when the opening 15a is formed by PEP, a provisional curing step, which is called pre-bake, is performed in the sealing step, and complete curing is not performed. In this case, complete heat curing is performed after the opening is formed by PEP.

As regards the details of the step of forming the insulation side portion 15, method 1 to method 5 are illustrated in FIG.

Figure 13C:
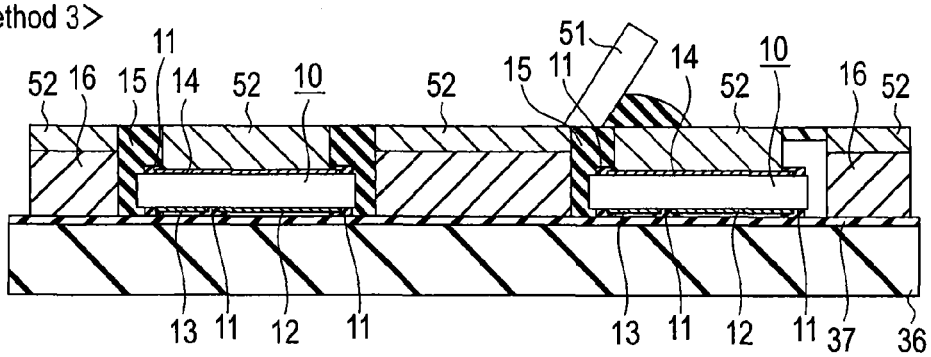
FIG. 13C is a detailed explanatory view of a resin seal step in the assembly process of the semiconductor package.
Figure 13D:
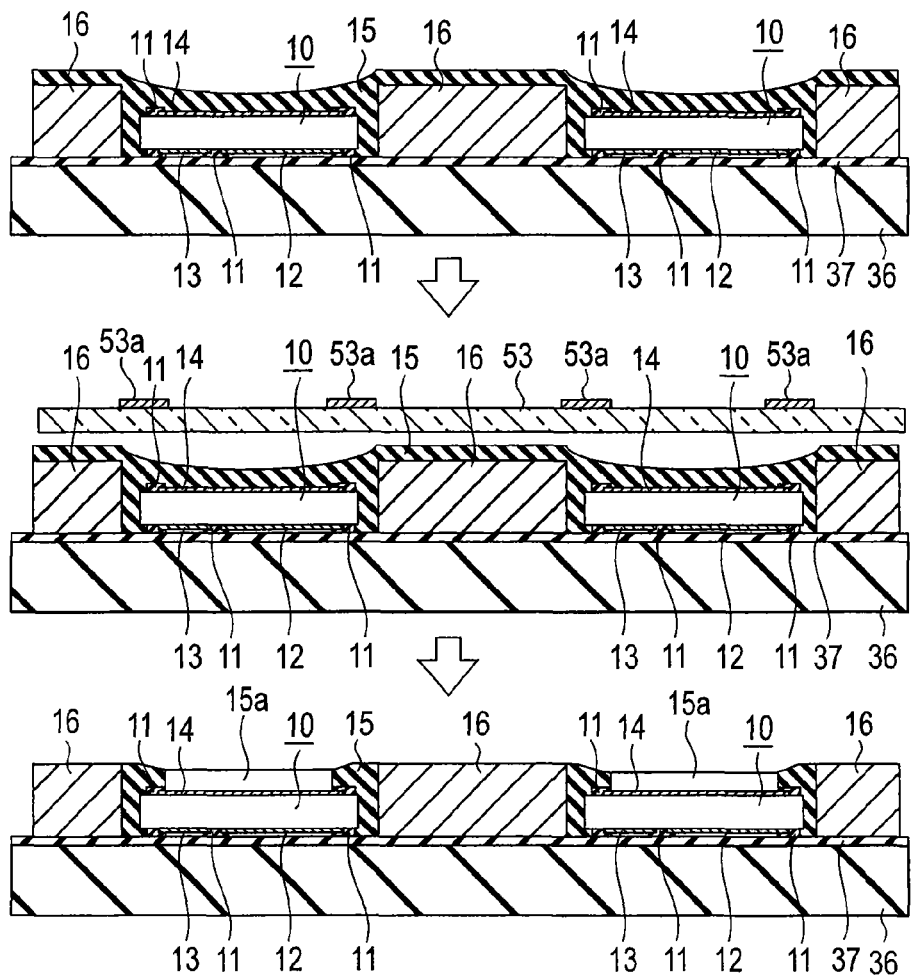
FIG. 13D is a detailed explanatory view of a resin seal step in the assembly process of the semiconductor package.
Figure 13E:
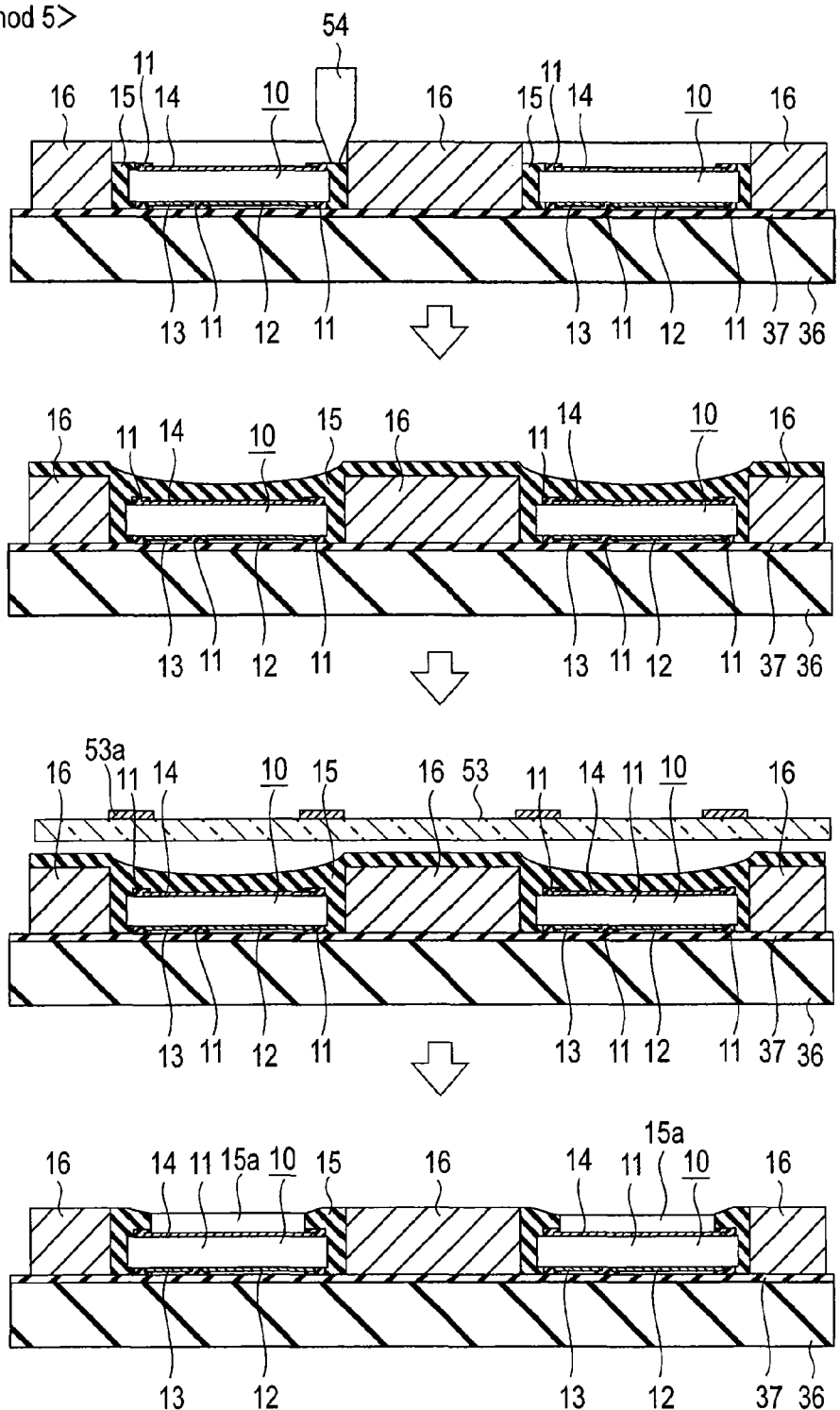
FIG. 13E is a detailed explanatory view of a resin seal step in the assembly process of the semiconductor package.

13A to FIG. 13E. As illustrated in FIG. 13A, in method 1 of the forming step of the insulation side portion 15, without placing a metal mask, an insulation material is coated on the side surfaces and front surface of the semiconductor chip 10 by a printing method which treats the conductive frame 16 like a mask. In the case of such a printing method, a vacuum printing method is applied, where necessary, in order to avoid mixing of a void on the side surfaces of the semiconductor chip 10.

As illustrated in FIG. 13B, in method 2, screen printing or vacuum printing is applied, and patterning by a metal mask 52 is performed at a time of printing. In this case, in order to reduce a stepped portion due to an insulation resin, it is desirable to reduce the thickness of the metal mask 52 and, and in this example, a thin mesh mask with a thickness of, e.g. about 10 µmt is used.

As illustrated in FIG. 13C, in method 3, resin coating by screen printing and formation of an opening 15a by patterning are performed at the same time. In method 3, if incomplete filling or void mixing occurs in the printing in the atmospheric air, vacuum printing is performed. In this case, a mask for the opening 15a on the chip electrode is formed in the metal mask 52, and thereby it is possible to avoid resin formation at a chip electrode position where an opening is formed in a later step. Thus, a PEP-less process or a laser-processing-less process after resin sealing can be implemented. In the meantime, due to the influence of the above-described variance of ±50 µmt in thickness of the semiconductor chip 10, it is possible that surface asperities occur on the metal mask surface when the metal mask is placed on the sample. However, if a squeegee 51 with a relatively high elasticity (e.g. a squeegee made of a urethane resin or a low-hardness nylon resin) is applied, it is possible to obtain a sufficient filling force while tracing the mask asperities due to the semiconductor chip 10.

As illustrated in FIG. 13D, method 4 is a resin filling method by a spin coater. In this method, the entire work is disposed by suction on the apparatus, and a relatively large amount of insulation resin is coated on the entire surface. Then, by rotating the sample at a fixed rotational speed, an excess insulation resin on the surface is removed by centrifugal force, and a film of insulation resin with a fixed film thickness is formed on the sample surface. In method 4, a glass wafer 53, on which masks 53a are formed at positions corresponding to extension portions of the recessed part, is placed, and openings are formed in the insulation resin by exposure and development, as illustrated in FIG. 13D. Specifically, only predetermined portions on the chip electrode parts are opened. Although the insulation resin, which is applied, is required to have photosensitivity, most of the above-described currently dominant insulation materials (excluding the epoxy-based sealing material) have photosensitivity, and various insulation resins can be selected. In addition, as regards the positive/negative type, it is possible to adapt to this type by altering the light shield pattern of the glass mask. Besides, as regards some non-photosensitive insulation materials, even when such materials are coated by the spin coater, openings are formed by forming apertures by laser processing.

As illustrated in FIG. 13E, method 5 is a method of improving the filling properties of method 4. When the depth between the semiconductor chip 10 and conductive frame 16 is large, it is difficult to achieve complete filling with insulation resin by spin coat. Thus, in method 5, an insulation resin is first coated around the semiconductor chip 10 by a dispenser. By the low viscosity and surface tension of the insulation resin, the insulation resin is filled in a manner to cover the side surfaces of the semiconductor chip 10. Then, the insulation resin is coated once again on the surface, an excess portion is removed by centrifugal force by spin coat, and the planarity of the surface is obtained. In this method, too, a recessed part forms after spin coat in the area where the semiconductor chip 10 is mounted. In this method, a glass wafer 53, on which masks 53a are formed at positions corresponding to extension portions of the recessed part, is placed, and openings are formed in the insulation resin by exposure and development, as illustrated in FIG. 13E. Specifically, only the chip electrode parts are opened. Although the insulation resin, which is applied, is required to have photosensitivity, most of the above-described currently dominant insulation materials, excluding the epoxy-based sealing material, have photosensitivity. In addition, as regards the positive/negative type, it is possible to adapt to this type by altering the light shield pattern of the glass mask. Besides, as regards some non-photosensitive insulation materials, even when such materials are coated by the spin coater, openings are formed by forming apertures by laser processing.

In the meantime, when openings are formed at the chip electrode parts by laser processing or printing, complete heat curing of the resin material is performed in the sealing step. On the other hand, when openings are formed by PEP, a provisional curing step, which is called pre-bake, is performed in the sealing step, and complete curing is not performed. In this case, complete heat curing is performed after the opening is formed by PEP.

After the insulation side portions 15 are formed by the above-described methods, a seed layer 40, which becomes an underlayer at a time of forming the rewiring 17, is formed as shown in part (f) of FIG. 9B. The seed layer 40 is a metal layer. In this example, as the seed layer 40, a Ti/Cu layer is formed. Of this layer, a Ti layer is a layer which is provided in order to improve the adhesive strength between the Cu plating film and the Al of the chip electrode. Thus, the material of the seed layer 40 is selected in accordance with the kind of plating. In this embodiment, since the plating is Cu plating, the seed layer 40 is formed of at least two layers including the Ti layer which is the adhesive layer.

The seed layer 40 is formed by, for example, a sputter method. When the seed layer 40 is formed by the sputter method, a surface cleaning step, which is called reverse sputter, is performed before forming the film of Ti. In this reverse sputter step, the sample surface is activated by producing a plasma in a noble gas atmosphere of, e.g. Ar. In particular, there is an advantage that a new surface is exposed by removing an oxide film on the Al electrode surface of the semiconductor chip 10. Even when the chip electrode is not formed of Al material, the same advantage is obtained. However, since Al, in particular, is very easily oxidized and an oxide film is quickly formed in the atmospheric air, resulting in degradation in electrical characteristics, the reverse sputter step is an effective process.

In the meantime, the seed layer 40 is formed of a material with a thickness, for example, Ti/Cu=about 1500/2000 Å. However, when asperities occur on the formed film surface as in the present structure, the thickness is increased to, e.g. Ti/Cu=2000/6000 Å or 3000/9000 Å. Thereby, a film formation defect (step breakage) of the seed layer 40 is avoided.

In order to reduce wiring erosion due to soldering after board mounting, it is possible to provide an Ni layer so that the material of the seed layer 40 may have the composition of Ti/Ni/Cu=1500/6000/3000 Å. Furthermore, depending on the amount of solder and the purpose of use and environment of use of the semiconductor package 1, the thickness of Ni may be increased or decreased. Besides, for instance, compositions such as Ti/Ni/Pd/Cu or Ti/Ni/Pd/Au, or other materials, with which adhesive strength can be obtained, are usable. In addition, it is possible to apply a method of removing an Al surface oxide film in a WET step such as a zincate process.

Further, as illustrated in part (g) of FIG. 9B, a resist 41 is coated on the seed layer 40 and is patterned. In this step, patterning of a rewiring 17 on the back side of the semiconductor chip 10 is performed. Since contact with the conductive frame 16, which is disposed on the side surface of the semiconductor chip 10, is necessary, the resist 41 (e.g. THB-151N, etc., manufactured by JSR Corporation) is patterned so that a most part thereof may come in contact with the conductive frame 16.

The model number of the resist 41 is selected such that a film with a necessary thickness can be formed in accordance with the thickness of the rewiring 17, but the thickness of the resist 41 should preferably be set such that a film with a thickness, which is greater by about 20% than a target value of the thickness of the rewiring 17, can be formed, in consideration of the uniformity in in-plane thickness at a time of soldering. In addition, the material, which traces surface asperities, and the film formation condition are adjusted from the adjustment of viscosity. Although the resist 41 may be formed by a printing method, the resist 41 should preferably be formed by PEP in the case where it is difficult to apply a printing method to the peelable resist 41 which is used in photolithography.

As illustrated in part (h) of FIG. 9B, a plating film is formed and thereby a rewiring 17 on the drain electrode side is formed. In this case, a Cu thickness, which is necessary in order to meet package specifications, is calculated, and the rewiring 17 is formed with a thickness of, e.g. about 85 μmt. The Cu of the seed layer 40 and the Cu plating film of the rewiring 17 form a metallic bond, and it is difficult to determine the boundary thereof even by cross-sectional observation. Thus, as a result, the seed layer 40 and the plating film are combined, and the rewiring structure of Ti/Cu is provided. Incidentally, in the Figures, excluding the Figures illustrating the formation step of the seed layer 40, the rewiring structure including the seed layer 40 is depicted as the rewiring 17. In the meantime, the plating method makes it possible to form batchwise rewirings on many semiconductor packages 1 at a time, and is suitable for an improvement of productivity, although depending on the number of chips taken per wafer.

The plating metal needs to be a low resistance material and a high heat conduction material, since this is a factor which determines the resistance and heat resistance of the semiconductor package 1. In this embodiment, a Cu material is taken as an example, considering that this is a relatively simple plating, but other metals are also applicable.

Figure 10A:
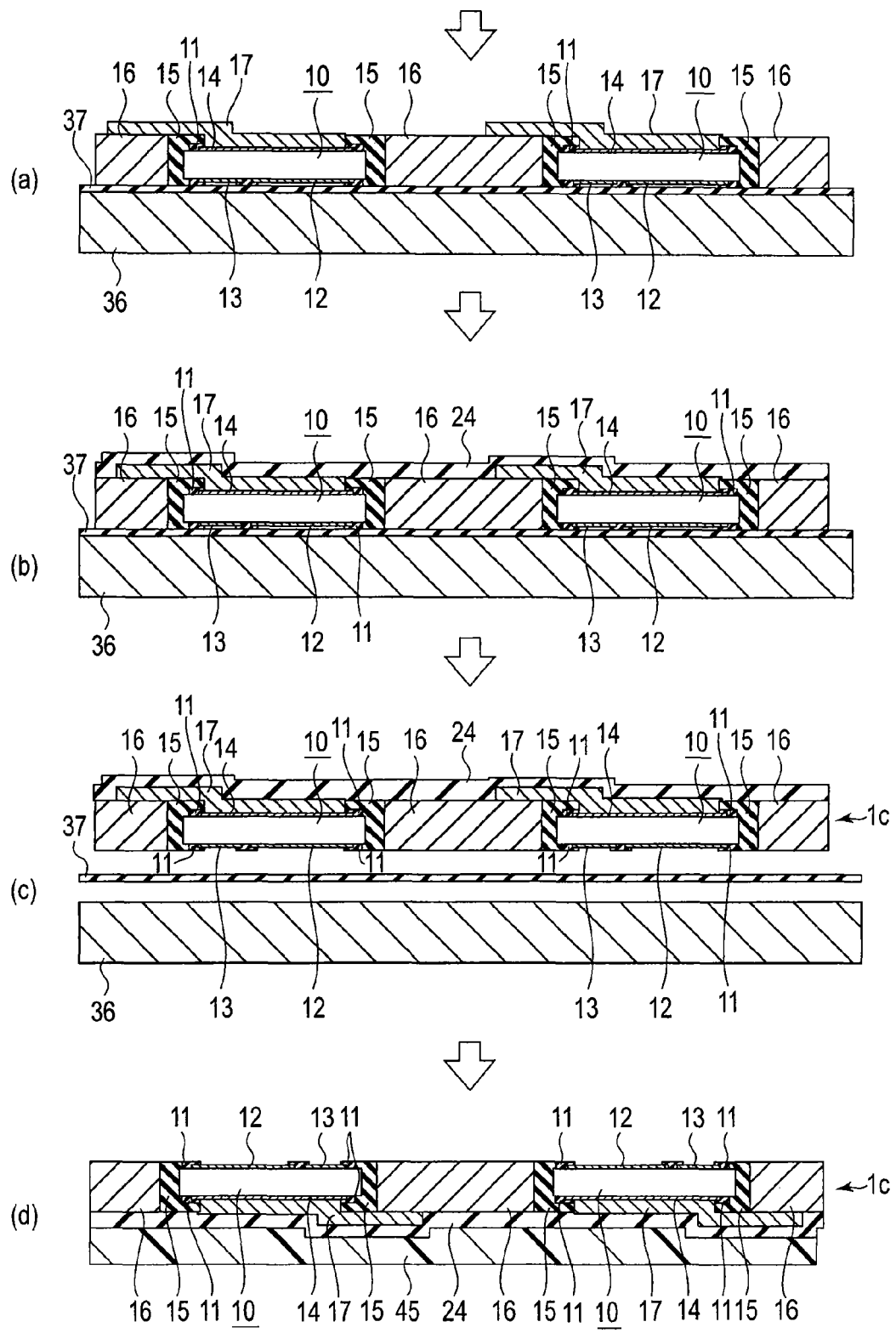
FIG. 10A is an explanatory view illustrating the assembly process of the semiconductor package.
Figure 11:
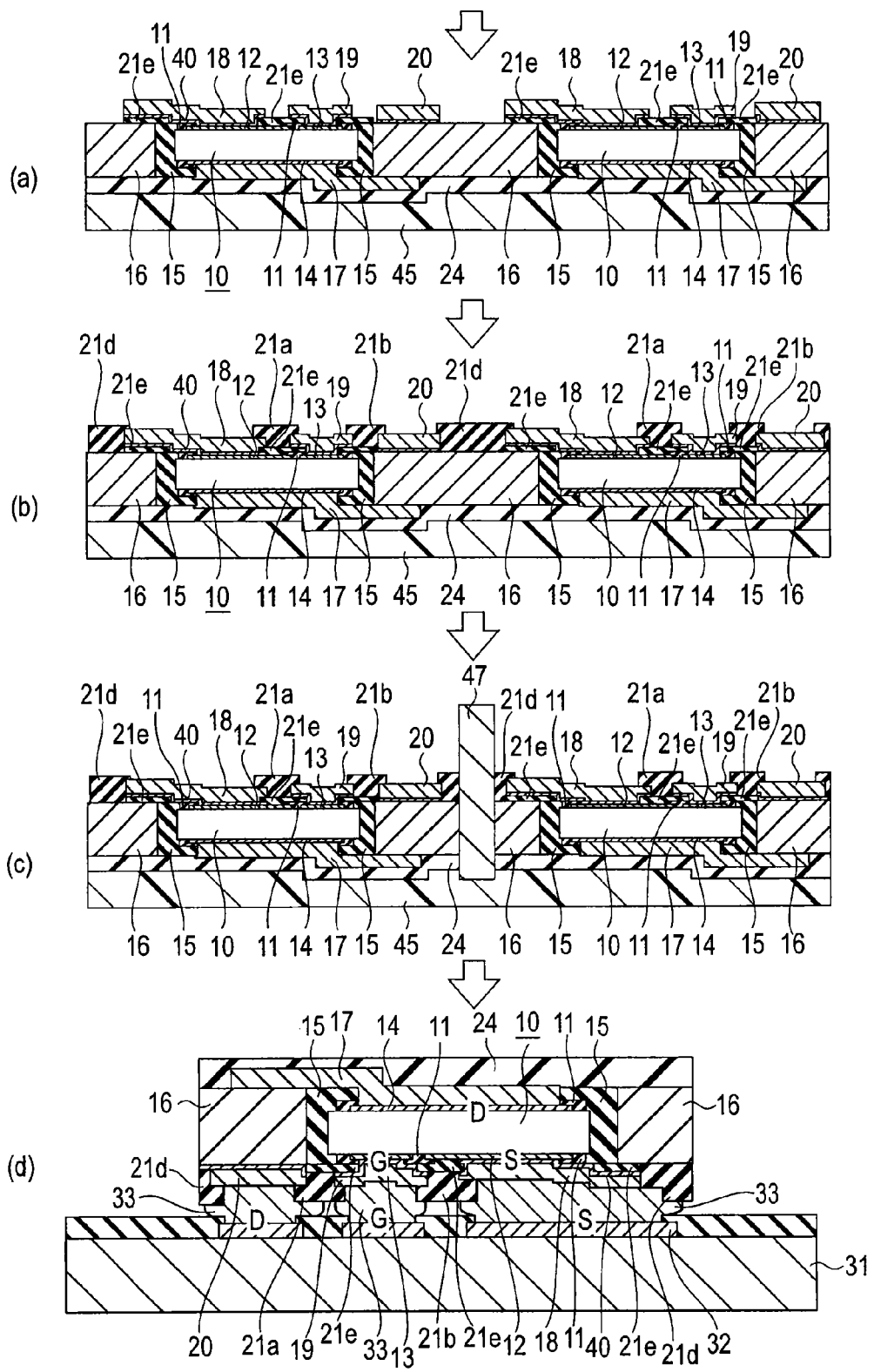
FIG. 11 is an explanatory view illustrating the assembly process of the semiconductor package.

Next, as illustrated in part (a) of FIG. 10A, the resist 41, which was used as the mask of the plating film, is peeled, and the seed layer 40 is etched away. In this example, although the resist 41 is peeled by a WET process, the resist 41 may be peeled by other methods using, for example, a solvent-based release agent (acetone, etc.), an alkali release agent (THB-S17 manufactured by JSR Corporation, release agent 106, etc. manufactured by TOK Co. Ltd.), etc., which can be selected in accordance with the characteristics of the resist 41. It is desirable to select the resist 41 which is not damaged due to the kind of plating liquid and has high releasability. It is preferable to select the kind of liquid, apparatus, liquid temperature and stirring method, which are applicable to both single wafer processing and batch processing, so that no residual may remain.

Subsequently, as illustrated in part (b) of FIG. 10A, an insulation film 24 is formed. In this step, an insulation resin is formed on the surface corresponding to the back surface (on which no external electrode exists) of the semiconductor package 1. In the case of forming the insulation film 24, the insulation film 24 can be uniformly formed by a spin coater or the like, and can also be formed over the entire surface by a printing method. As the material, use may be made of a material called a permanent resist, or a material called a solder resist, and where necessary, green, blue or black can be selected. For improving laser marking properties and light shielding on the back surface of the semiconductor chip 10, it is also possible to select a material which is not semitransparent and is non-light-transmissive. In addition, in order to planarize a stepped portion forming due to the rewiring 17, it is possible to form a resin with a large thickness. However, since the heat resistance increases as the thickness becomes greater, heat radiation properties are considered in the setting.

Next, as illustrated in part (c) of FIG. 10A, the provisional fixing material 37 is peeled. In this step, the provisional fixing material 37, which is attached to the substrate 36, is first peeled, and then the conductive frame 16, semiconductor chip 10, insulation material 15 and rewiring 17, which are in the integral state, are released. In this example, the released sample, namely the conductive frame 16, semiconductor chip 10, insulation material 15 and plating film, which are in the integral state, is referred to as "pseudo-wafer 1c".

Subsequently, as illustrated in part (d) of FIG. 10A, the pseudo-wafer 1c is inverted, and a protection sheet 45 is attached to the surface (the surface sealed with the insulation resin) on which the rewiring 17 is formed. This has an advantage that asperities on the insulation resin surface are canceled, and an advantage that suction of the pseudo-wafer 1c on each device at a time of product flow (conveyance) is facilitated, and asperities on the surface are flexibly canceled by the protection sheet including a relatively thick adhesive layer. Incidentally, the protection sheet 45 may be omitted from the standpoint of cost reduction. As the protection 45, use is made of, for example, a UV-curing type sheet which is usually a dicing sheet 46, or a low-adhesivity sheet.

Next, as illustrated in part (e) of FIG. 10B, an insulation resin is formed by PEP or printing, and thereby electrode insulation portions 21e are formed. The electrode insulation portions 21e serve to effect insulation from the conductive frame 16 when rewiring electrodes 18 and 19 are formed by plating at parts of the third chip electrode 13 and second chip electrode 12 of the semiconductor chip 10. The electrode insulation portions 21e are patterned in accordance with the design of the semiconductor package 1. Similarly, the electrode insulation portion 21e is also formed at an area where the external electrode 20 and chip electrode 12 (source) interfere at a time of forming the rewiring electrode 20, and prevents short-circuit.

The conductive frame 16, which is disposed on the side surfaces of the semiconductor chip 10, exists around the four sides of the outer periphery of the semiconductor chip 10 even after each semiconductor package 1 is singulated, and electrical conduction to the drain electrode 14 of the semiconductor chip 10 is obtained by the rewiring on the drain electrode 14 side. In addition, the electrode insulation portion 21e is present between the conductive frame 16 and the rewiring electrode 18 of the first chip electrode 12, and since the area in the thickness direction, which lowers heat radiation properties, is narrow, it should suffice if the material of this insulation resin, like the material of the insulation side portion 15 and insulation film 24, is selected by placing the highest importance on the high withstand voltage.

Next, as illustrated in part (f) of FIG. 10B, a seed layer 40 is formed (Ti/Cu sputter). In this step, the seed layer 40 of Ti/Cu is formed by sputter over the entirety of one-side surface of the semiconductor chip 10, conductive frame 16 and the insulation resin.

Subsequently, as illustrated in part (g) of FIG. 10B, a resist 41 is coated and patterned by PEP. In this step, the rewiring on the front surface (gate and source electrodes) side of the semiconductor chip 10 is patterned, and the pattern of the rewiring electrodes (external electrodes) 18 to 20 of the gate, source and drain are formed. At this time, the distance between the rewirings and the distance between the external electrodes need to be adjusted so that the rewiring electrodes 18 to 20 of the gate, source and drain can have sufficient insulation properties in the horizontal direction at electrode insulation portions 21 which will be formed later. The model number of the resist 41 is selected such that a film with a necessary thickness can be formed in accordance with the thickness of the rewiring electrodes 18 to 20. The thickness of the resist 41 should preferably be set such that a film with a thickness, which is greater by about 20% than a target value of the thickness of the rewiring can be formed, in consideration of the uniformity in in-plane thickness at a time of soldering. In addition, the material, which traces surface asperities, and the film formation condition are adjusted from the adjustment of viscosity.

Next, as illustrated in part (h) of FIG. 10B, plating films are formed at predetermined areas, and thereby rewiring electrodes 18 to 20, which become the external electrodes of the gate, drain and source, are formed. This step is the same as the above-described plating step, and, for example, Cu plating films are formed. In the meantime, the Cu of the seed layer 40 and the Cu plating film form a metallic bond, and it is difficult to determine the boundary thereof even by cross-sectional observation. As a result, the seed layer 40 and the plating film are combined, and the rewiring structure of Ti/Cu is provided.

As illustrated in part (a) of FIG. 11, the resist 41 is peeled, and the seed layer 40 is etched away. In this step, the resist 41, which was used as the mask of plating, is peeled. This step is the same as the above-described resist peeling step.

As shown in part (b) of FIG. 11, an insulation film (corresponding to a solder resist) is formed, and electrode insulation portions 21 are formed. In this step, an insulation resin (corresponding to a solder resist) is formed on the surface corresponding to the front surface (the surface on which the external electrodes are present) of the semiconductor package 1.

In the case of forming the insulation resin, the insulation resin can be uniformly formed by a spin coater or the like, and an opening can be formed by PEP. The insulation resin can also be formed by patterning with use of a metal mask by a printing method. As the insulation material, use may be made of a material called a permanent resist, or a material called a solder resist, and where necessary, green, blue or black can be selected. In addition, for the purpose of light shielding and secrecy, it is also possible to select a material which is not semitransparent and is non-light-transmissive. For example, in this example, the thickness of about 3 to 5 μmt is necessary at the opening of the external electrode, and the total thickness is adjusted depending on the thickness of the rewiring.

As illustrated in part (c) of FIG. 11, the protection sheet 45 is peeled, and singulation by dicing is performed. In this step, the protection sheet 45, which is attached to the back surface of the semiconductor package 1, is first peeled, and instead a dicing sheet 46 is attached. As regard the peeling of the protection sheet 45, the adhesive strength is decreased by UV irradiation and the protection sheet 45 is peeled, or the protection sheet 45 may be peeled by using a sheet with a low adhesive strength from the beginning. In addition, if the dicing sheet 46 is used for the protection sheet 45, this step of replacing the sheet can be omitted.

The dicing sheet 46 should preferably have a relatively high adhesive strength, so that a movement of the semiconductor package 1 at a time of singulation may not damage a blade 47 or may not influence the variance in outside dimensions of each semiconductor package 1. In many cases, a UV-curing type dicing sheet 46 is applied. However, if the size of the semiconductor package 1 is large and has a structure which can relatively easily secure adhesive strength, it is possible to apply a non-UV-curing type dicing sheet 46.

It is generally said that the limit of the processing depth of the dicing blade 47 is about 5 to 10 times the width of the blade 47. Thus, if the thickness of the semiconductor package 1 is about 300 μmt, the blade 47 should preferably have a width of at least 30 μm or more, and should desirably have a width of, e.g. 50 μm or more.

As the blade 47, there are various model numbers with various features, such as an Ni electroforming blade, a metal blade, and a resin blade. Considering that the processing of metal material is relatively difficult, and that stable processing is also difficult for dicing of a multilayer structure of different materials such as an insulation resin and a metal, it is preferable to apply a resin bond blade with a high cutting force, although the blade life becomes shorter. On the other hand, the electroforming blade or metal blade is also applicable if it is capable of processing, in consideration of other characteristics (diamond grain size, bond material fixing force) of the blade 47 or devices in processing conditions. After singulation, the dicing sheet 46 is peeled. A characteristic test of each semiconductor package 1, marking on the back surface of the semiconductor package 1 and packing in a reel or the like are performed, and the semiconductor package 1 is completed.

As illustrated in part (d) of FIG. 11, the semiconductor package 1 is inverted and attached to the mount board 31 by soldering. The semiconductor package 1 after singulation can be bonded to the board, like surface mount components, as shown in the Figure. By the rewiring electrodes 18 to 20 which are the external electrodes aggregated on one side of the semiconductor package 1, the semiconductor package 1 is mechanically and electrically connected via a land pattern formed on the mount board 31 and bonding materials 33 such as solder, Ag paste and Cu paste. As regards concrete bonding methods, like surface mount components, the semiconductor package 1 is bonded by solder paste coating, component mounting, and batch connection by reflow.

In the semiconductor package 1 according to the present embodiment and the manufacturing method of the semiconductor package 1, wire bonding is not performed, and the electrodes for both sides are put together on one side, and the semiconductor package is fabricated. Thereby, such advantageous effects are obtained as a low ON-resistance of a power semiconductor device, high reliability, high operational efficiency, an improvement in general-purpose use, reduction in size and thickness of a power module, high reliability of the power module, an improvement in degree of freedom of design, and an improvement in productivity.

Specifically, electrical connection is made by mainly using the plating method. Thereby, adjustment of wiring thickness is made easier. Compared to wire bonding or other connection methods, connection with a low electrical resistance can be made. Since a large area is connected with a metal, such a structure is made that an improvement in heat radiation in the thickness direction can be expected. In addition, the reliability (uniformity in electric current, reduction of thermal damage, and connection strength) is enhanced.

Besides, batch rewiring formation in the wafer level is possible, and productivity is enhanced. In other words, by virtue of the above-described advantageous effects, the characteristics of the semiconductor chip 10 can be improved (a higher output is possible), and as a result the characteristics of the power module can be improved.

The conductive frame 16 is adopted, and the electrical connection is made by using the plating method. Thereby, an electrical conduction path in the thickness direction of the semiconductor package 1 can be constituted, and the surface component mounting (one-side component mounting) of the semiconductor chip 10, which has electrodes on the front and back sides thereof, is realized. Thus, conventional individual connecting steps, such as connecting the semiconductor chip 10 to the board by mounting, or connecting the semiconductor chip 10 to the board electrodes by wire bonding, can be dispensed with. Furthermore, since planarization can be effected by sealing with the conductive frame 16 and insulation side portion 15, a variance among chips can be canceled.

Since plating connection is made on the entire surface of the chip electrode, there is significance in mechanical connection reliability, electrical connection reliability, and connection reliability to the board (electrical characteristics, mechanical connection strength, thermal fatigue resistance characteristics, and heat conductivity characteristics). In addition, breakage of connection parts due to thermal expansion or contraction hardly occurs, a large cross-sectional area of rewiring and rewiring electrode connection area can be obtained, and a low electrical resistance (a low ON-resistance of the semiconductor package 1) can be obtained. Furthermore, since there is no hot spot occurring at a time of wire bonding, thermal damage to the semiconductor chip 10 can be reduced. Since low resistance and low thermal damage can be realized, it is possible to cause a still larger current to flow. Thus, the characteristics of the semiconductor chip 10 can be improved, the characteristics of the semiconductor package 1 and the characteristics of the module can be improved, and a lower height is possible.

In the structure of the semiconductor package 1 of the present embodiment, batch fabrication is possible in the wafer level and the productivity is high. Further, in the method of manufacturing the semiconductor package 1 according to the embodiment, a variance in thickness, which is a major problem, can be cleared up for SiC semiconductor chips 10 which are called advanced products, and semiconductor packages 1, to which SiC is applied, can be realized.

As a comparison-object structure, there is a wire bonding/ribbon bonding technique. In this structure, a wiring resistance is high, a current density is non-uniform, connection reliability and thermal reliability are low, and reduction in height (reduction in thickness) is difficult. For example, since a high electric current concentrates at a connection part of wires, there is a local high-temperature area called a hot spot, the non-uniformity of thermal damage adversely affects thermal reliability, and a heat resistance increases. In addition, the thickness of Al wire is large in order to adapt to a large electric current, it is difficult to increase the number of wires because of deficiency in bonding area, an increase of output of the module is difficult, and an ON resistance is high. Moreover, owing to the local connection method, the connection reliability is low, and it is difficult to improve the reliability of the module. Since wire bonding is performed on each semiconductor chip after the semiconductor chip is mounted and connected to the board, there are many individual wiring fabrication steps. Consequently, the improvement of productivity is difficult and the flexibility for pattern design of the mount board is low.

As another comparison-object structure, for example, there is a connector or lead bonding technique. In this technique, although the wiring resistance can be improved, there are few other merits.

As still another comparison-object structure, for example, there is a technique in which a power module is formed by making a connection to the board-side pattern by rewiring. In this structure, it is necessary to provide a high withstand voltage by an insulation film in the thickness direction. At the same time, from the standpoint of heat radiation properties in the thickness direction, an insulation film covering the semiconductor chip and board needs to be an insulation film with a high heat conductivity. Thus, since a special material is used, the material cost increases. In addition, after the semiconductor chip is mounted and connected to the mount board, the insulation film is formed and by lamination and an opening is formed by a laser. Thereafter, patterning for plating is performed, and plating is carried out. Thus, flexibility for alteration of pattern design is low. Since the number of obtained semiconductor chips is smaller, relative to the large-area plating step, the productivity is considerably low. Hence, the cost merit is low. Similarly, the distance (wiring length) necessary for plating wiring is long, and a large quality of material is used, leading to demerits in environmental load and cost.

Compared to these techniques, the semiconductor package 1 according to the embodiment has many merits. In the semiconductor package 1, electrical connection can be made by plating over the entire surfaces of the chip electrodes 12 to 14, and adjustment of thickness can also be made. Thus, the wiring resistance is low, the current density can be made uniform, the reliability of connection can be enhanced, and the reduction in height is realized.

In addition, in the structure of the embodiment, the chips 12 to 14 on the semiconductor chip 10 are not connected to the pattern on the board, but the single semiconductor package 1 is made. Thus, compared to the insulation film covering the semiconductor chip 10, neither the high withstand voltage nor the high heat conductivity is needed. Therefore, since the range of selection of materials becomes wider and general-purpose products can be used, the cost can be reduced. In the meantime, in the semiconductor package 1, in order to secure electrical insulation of each external electrode, it is necessary to apply an insulation material (corresponding to a solder resist), but this mainly aims at providing a function for securing insulation in the horizontal direction, as viewed from the cross section of the semiconductor package 1, and parts, which require insulation in the thickness direction of the semiconductor package 1, are few and thin. In addition, since there are few parts where the insulation resin is formed in a manner to shield the radiation path of the semiconductor package 1, the insulation resin does not require particularly high heat conduction characteristics.

Moreover, the distances between the rewiring electrodes 18 to 20, which become the external electrodes, can be varied by design, and sufficient inter-electrode distances and thicknesses can be provided for the withstand voltage characteristics of the present general-purpose insulation materials. Accordingly, low-cost insulation resin materials can easily be selected.

Besides, by constructing the semiconductor package 1 by applying plating in the wafer level, batchwise wiring can be made. Thus, compared to the case in which plating patterning is performed after mount connection on the board, the productivity can be improved. Since general-purpose surface mount materials, such as solder or conductive pastes, can be applied to the method of connecting the semiconductor package 1 to the board, the degree of freedom of patterning of the board is improved and the productivity is enhanced.

Second Embodiment

Figure 14:
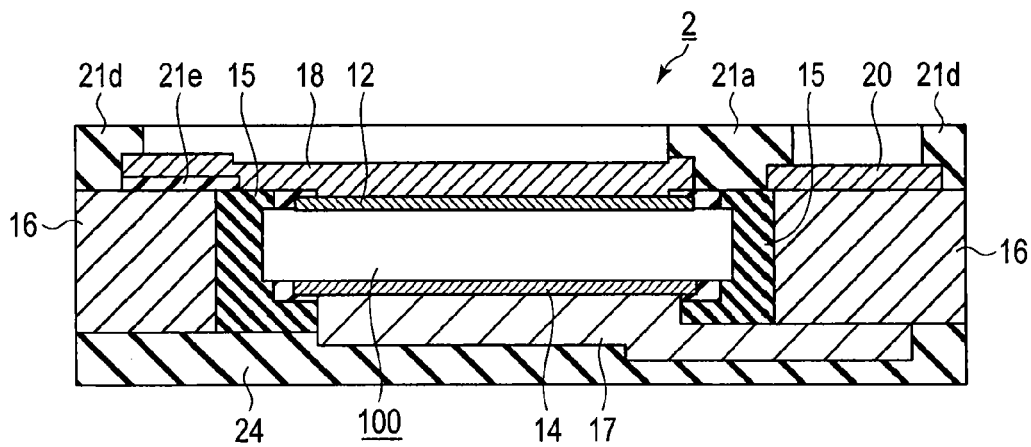
FIG. 14 is a cross-sectional view of a semiconductor package according to a second embodiment.
Figure 15:
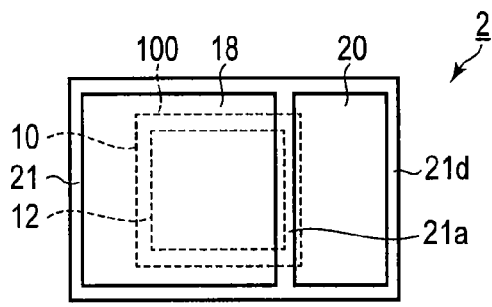
FIG. 15 is a plan view of the semiconductor package.

Next, a semiconductor package 2 according to a second embodiment is described with reference to FIG. 14 and FIG. 15. This embodiment is directed to a semiconductor chip 100 having one electrode on the front surface and one electrode on the back surface. The other features are the same as in the first embodiment, and a description of common parts is omitted.

The semiconductor package 2 has a structure including, as an object, the semiconductor chip 100 which is a so-called diode semiconductor chip having one electrode on the front surface side of the semiconductor chip 100 and one electrode on the back surface side. FIG. 14 is a cross-sectional view of the semiconductor package 2 according to the present embodiment, and FIG. 15 is a plan view thereof. Since the bottom view is the same as FIG. 3, it is omitted here. The semiconductor package 2 includes a semiconductor chip 100 having electrodes on both sides thereof, respectively; an electrically conductive frame 16 surrounding the semiconductor chip 100; an insulation side portion 15 provided between the semiconductor chip 100 and the conductive frame 16; a rewiring 17 formed of a plating film on the back surface side of the semiconductor chip 100; a plurality of rewiring electrodes 18 and 20 which are formed of plating films on the front surface side of the semiconductor chip 100 and constitute external electrodes; electrode insulation portions 21 which insulate the chip electrode 12, conductive frame 16 and rewiring electrodes 18 and 20 on the front surface side of the semiconductor chip 100; and an insulation film 24 covering the back surface side.

Specifically, the semiconductor package 2 is also configured such that the rewiring electrodes 18 and 20, which become external electrodes, are put together on one side. The electrode 14 on the back surface side of the semiconductor chip 100 is led to the front side via the rewiring 17 in the horizon direction by plating and the conduction path in the thickness direction by the conductive frame 16, and thereby the external electrodes of the semiconductor package 2 are aggregated on one side, namely, on the front surface side, of the semiconductor chip 100.

With the semiconductor package 2 according to the embodiment, too, the same advantageous effects as in the above-described first embodiment can be obtained.

Third Embodiment

Next, a semiconductor package 3 according to a third embodiment is described with reference to FIG. 16 and FIG. 17. This embodiment is directed to a semiconductor chip 110 having a multi-electrode structure. For example, this embodiment is directed to the semiconductor chip 110 having three electrodes on the front side and one electrode on the back side. The other features are the same as in the first embodiment, and a description of common parts is omitted.

In this embodiment, it is assumed that the semiconductor chip 110 is, for instance, an IGBT chip. The semiconductor chip 110 has such a multi-electrode structure that three electrodes are provided on the front surface side, one electrode is provided on the back surface side, and a plurality of electrodes for a temperature monitor or a voltage monitor are provided in addition to the source, gate and drain.

Figure 16:
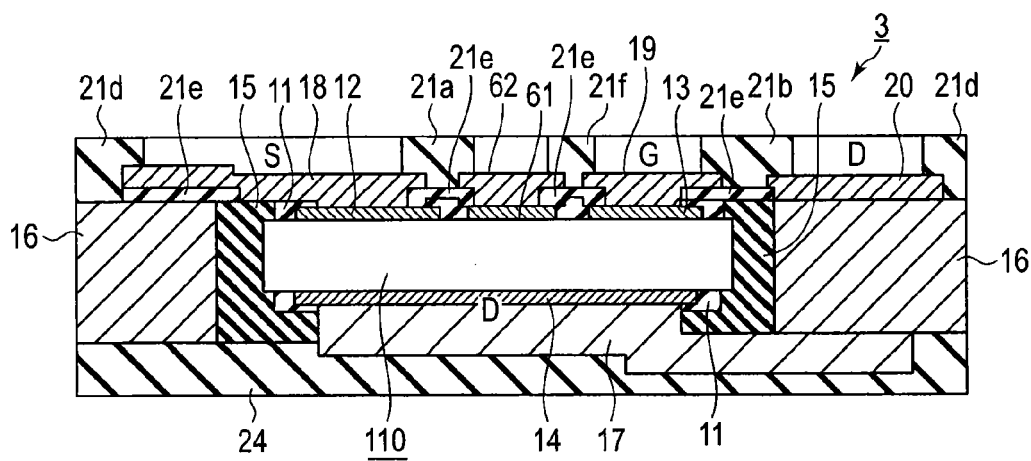
FIG. 16 is a cross-sectional view of a semiconductor package according to a third embodiment.
Figure 17:
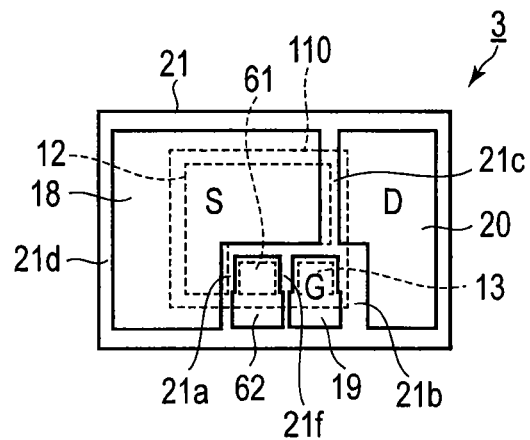
FIG. 17 is a plan view of the semiconductor package.

FIG. 16 is a cross-sectional view of the semiconductor package 3 according to the present embodiment, and FIG. 17 is a plan view thereof. Since the bottom view is the same as FIG. 3, it is omitted here. The semiconductor package 3 includes a semiconductor chip 110 having electrodes on both sides thereof, respectively; an electrically conductive frame 16 surrounding the semiconductor chip 110; an insulation side portion 15 provided between the semiconductor chip 110 and the conductive frame 16; a rewiring 17 formed by plating on the back surface side of the semiconductor chip 110; a plurality of rewiring electrodes 18, 19, 20 and 62 which are formed by plating on the front surface side of the semiconductor chip 110 and constitute external electrodes; electrode insulation portions 21 which insulate chip electrodes 12, 13 and 61, conductive frame 16 and rewiring electrodes 18, 19, 20 and 62 on the front surface side of the semiconductor chip 110; and an insulation film 24 covering the back surface side.

Specifically, the semiconductor package 3 is configured such that a fourth chip electrode 61 on the front surface side, a rewiring electrode 62 which is obtained by forming, e.g. a Cu plating film on the fourth chip electrode 61 and becomes an external electrode, and an electrode insulation portion 21f, which insulates the fourth chip electrode 61 and rewiring electrode 62, are added to the semiconductor package 1.

The semiconductor package 3 has such a structure that the external electrodes are put together on one side. The second chip electrode 14 on the back surface side of the semiconductor chip 110 is led to the front side via the rewiring 17 in the horizon direction by plating and the conduction path in the thickness direction by the conductive frame 16, and thereby the external electrodes of the semiconductor package 1 are aggregated on one side, namely, on the side of the gate, source and additional electrode of the semiconductor chip 110.

With the semiconductor package 3 according to the embodiment, too, the same advantageous effects as in the above-described first embodiment can be obtained. Since the conductive frame 16 covers the entire outer peripheral part of the semiconductor chip 110, if a plurality of electrodes are connected to the conductive frame 16, thereby to form conduction paths in the thickness direction, this would undesirably cause short-circuit. Thus, as regards wiring extension for putting together wirings on one side by the conductive frame 16, such wiring extension is conducted for only one electrode. Hence, although no selection is made as to the front/back side of the semiconductor chip 110 of the diode, in the case where there are a plurality of electrodes as in an IGBT, etc., it is desirable to perform wiring extension for only the second chip electrode 14 on the back surface of the semiconductor chip 110.

Fourth Embodiment

Next, a semiconductor package 4 according to a fourth embodiment is described with reference to FIG. 18 and FIG. 19. In this embodiment, an electrically conductive member 50 lies between the second chip electrode 14 and the rewiring 17. The other features are the same as in the first embodiment, and a description of common parts is omitted. In addition, since the fabrication steps, other than the step of forming the insulation side portion 15, are the same as those in the first embodiment, a description of common parts is omitted.

Figure 18:
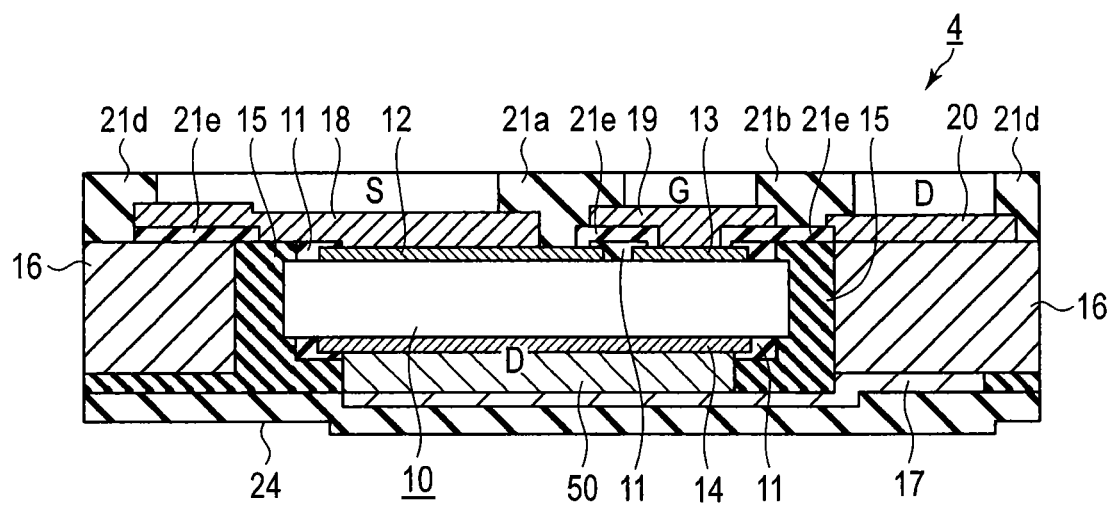
FIG. 18 is a side view of a semiconductor package according to a fourth embodiment.

FIG. 18 is a cross-sectional view illustrating the structure of the semiconductor package 4. In this semiconductor package 4, an electrically conductive member (e.g. Cu paste or Ag paste) 50 is formed on the chip electrode 14 (drain electrode) on that surface of the semiconductor package 1, which is opposite to the surface on which the external electrodes are formed. Specifically, the conductive member 50, which is electrically connected to the second chip electrode 14, is provided on the second surface of the semiconductor chip 10, and the rewiring 17 is formed on the other side surface of the conductive member 50. The conductive frame 16 and the second electrode 14 are electrically connected via the conductive member 50 and rewiring 17.

The conductive member 50 may be formed in a manner to cover the entire surface of the drain electrode of the semiconductor chip 10, but the conductive member 50 may also be formed in such a shape that an outer peripheral part of the drain electrode is exposed. The exposed outer peripheral part of the electrode is covered with the insulation side portion 15 and is insulated. The conductive member 50 is required to have, for example, low-resistance electrical characteristics and a high heat conductivity, and it is assumed that the conductive member 50 is formed of Cu or Ag paste by printing or potting, but it may be formed of a metal by plating or sputtering.

Figure 19:
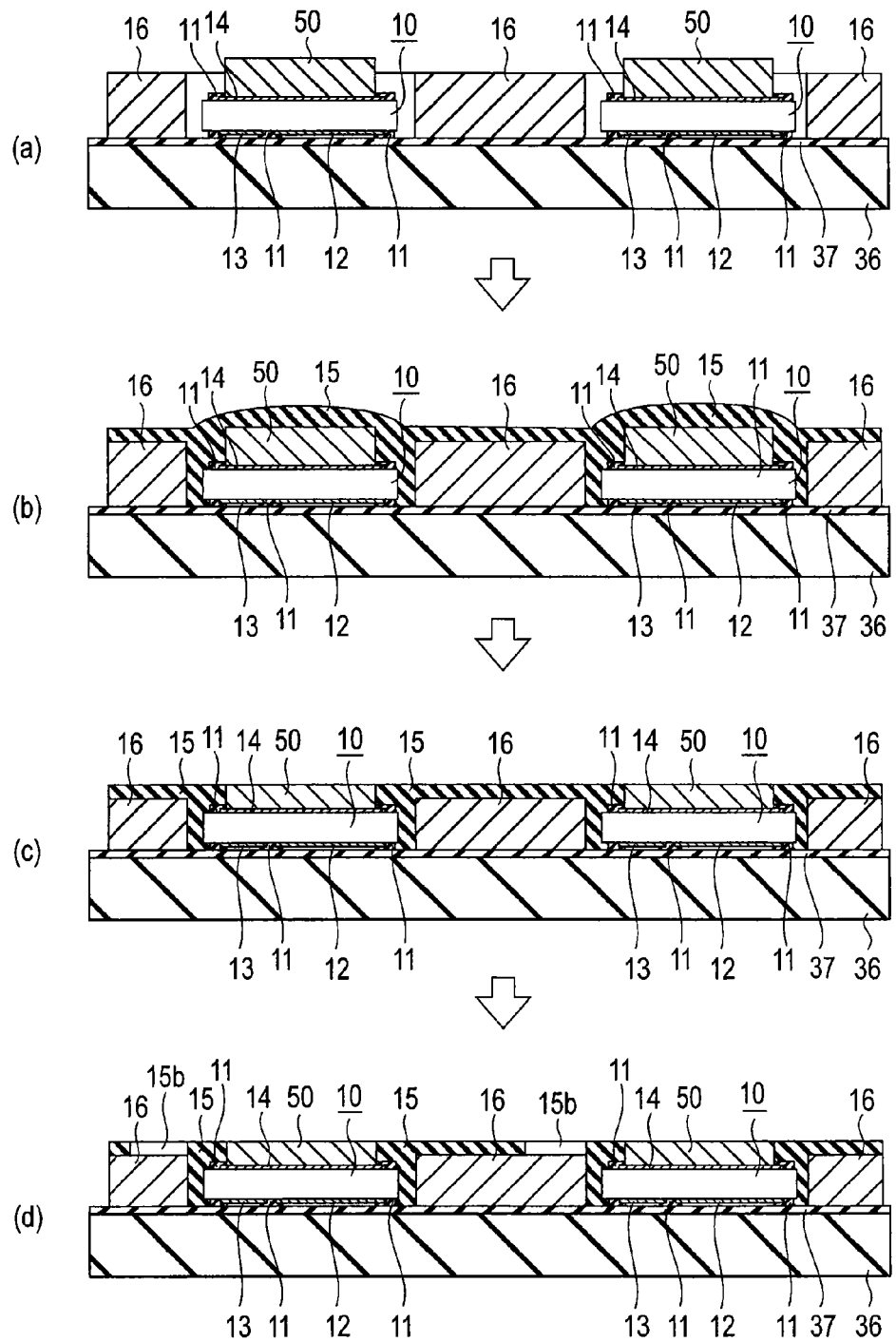
FIG. 19 is an explanatory view illustrating fabrication steps of the semiconductor package.

FIG. 19 is an explanatory view illustrating, as a part of fabrication steps of the semiconductor package 4, a step of forming the conductive member 50 which is a characteristic point, and a step of forming the insulation side portion 15. The insulation side portion 15 of the semiconductor package 4 is formed by the following steps. An electrically conductive member 50 is formed on the second chip electrode 14 on the second surface, and is cured. Thereafter, a film of an insulation material is formed in an opening 16a, and the insulation material and the conductive member 50 are ground. Thereby, the conductive member 50 is exposed, and the insulation side portion 15 is formed.

To begin with, as illustrated in part (a) of FIG. 19, a semiconductor chip 10 is disposed in an opening 16a of the conductive frame 16. In this state, an electrically conductive member 50, which is formed of Cu or Ag paste or a metal material, is formed on the back-side surface of the semiconductor chip 10. As regards the formation method, the conductive member 50 can be formed by pattern printing with patterning by a metal mask, or by potting by means of a dispenser. In addition, the conductive member 50 can be formed by plating or sputtering. In this case, such a method is suitable that masking is performed on the wafer, the conductive member 50 is formed, and then mounted in the opening 16a of the conductive frame 16. The entire surface of the electrode 14 may be covered with the conductive member 50, or an outpour peripheral part of the electrode 14 may be exposed.

Subsequently, as illustrated in part (b) of FIG. 19, by a method such as screen printing, or vacuum printing or printing after potting, an insulation resin is sealed in a region including side surfaces of the semiconductor chip 10, the surface of the conductive frame 16 and the upper surface of the conductive member 50 on the chip electrode, and the resin is cured.

Further, grinding is performed by a grinder or the like, and as illustrated in part (c) of FIG. 19, the surface is planarized, and a top portion of the conductive member 50 on the chip electrode 14 is exposed. At this time, taking the grinding precision, etc. into account, the amount of grinding is set such that a small amount of insulation resin remains on the conductive frame 16. Although adjustment is necessary depending on the grinding precision, an insulation resin of about 10 μmt should preferably remain.

After the grinding, in order to ensure electrical connection between the conductive member 50 and the conductive frame 16, an opening 15b needs to be formed in the insulation material. In the case of laser processing, processing can be performed after curing the resin. In the case of formation by PEP, the opening is formed before the curing, that is, at a stage before grinding.

With the semiconductor package 4 according to the embodiment, too, the same advantageous effects as in the above-described first embodiment can be obtained. In addition, the filling property of the insulation material can be enhanced. Furthermore, asperities can be eliminated by grinding, and batchwise wiring formation is enabled.

Figure 20:
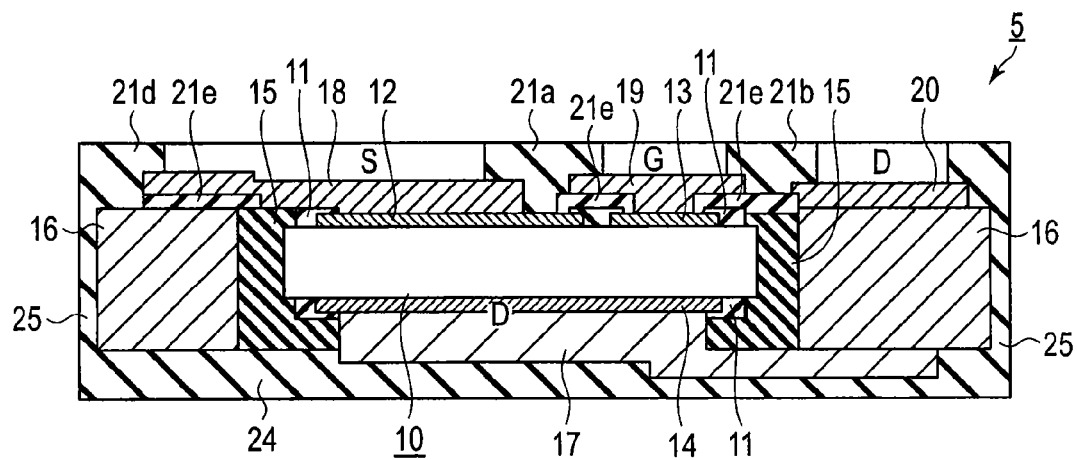
FIG. 20 is a side view of a semiconductor package according to another embodiment.

Aside from the above-described embodiments, various modifications are possible. For example, in the above embodiments, the insulation resin 24 (corresponding to a solder resist) is formed on the entirety of one surface of the semiconductor package 1 on the back surface side of the semiconductor chip 10. However, the embodiments are not limited to this example. For example, as illustrated in FIG. 20, an insulation film 25 may further be formed on side surfaces of the package. Taking insulation characteristics into account, this semiconductor package 5 is configured to ensure a countermeasure to degradation in external appearance due to oxidation of metal, etc., and to ensure protection from an outside stimulus such as moisture absorption. The insulation film 25 is formed and resin-sealed on the entire surface of the semiconductor package 5, excluding the openings of the rewiring electrodes 18 to 20 which become the external electrodes.

With this embodiment, too, the same advantageous effects as in the above-described first embodiment can be obtained. In addition, for example, after the semiconductor package singulation step by dicing, which is the final step of assembly in the wafer level, the insulation resin 25 is coated in trenches, which occurred due to the dicing, by a spin coater, screen printing or vacuum printing. After the insulation resin 25 is baked, the semiconductor package can be fabricated by re-singulation by means of a blade having a smaller width than the blade 47 which was used in the singulation.

Figure 21:
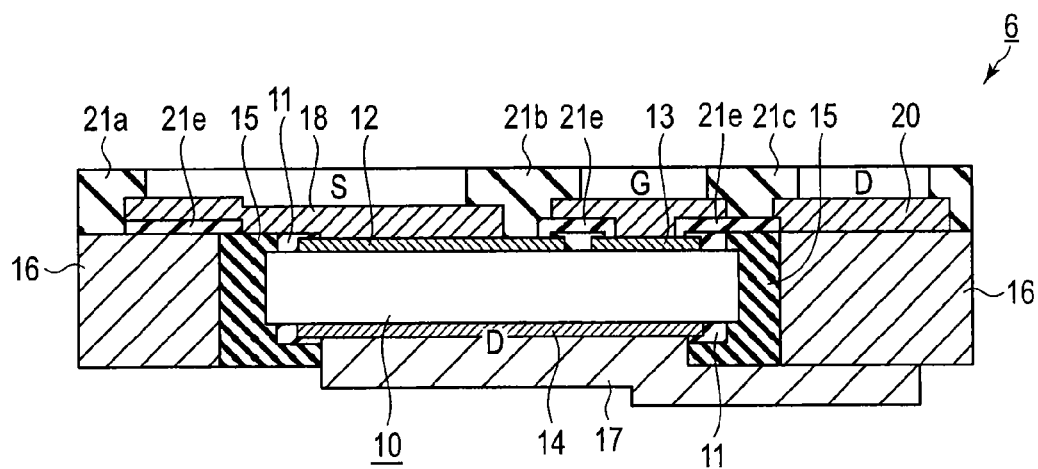
FIG. 21 is a side view of a semiconductor package according to another embodiment.

In addition, like a semiconductor package 6 shown in FIG. 21, the insulation film 24 may be omitted. In this case, higher heat radiation characteristics can be obtained. In particular, in many cases, when power modules are formed, the surface of the mount board 31 is entirely sealed with a semitransparent insulation material (gel material). Thus, since there is little concern about an electrical insulation defect from the back side of the package, this technique is applicable. Moreover, after the sealing with the semitransparent gel, oxidation of the metal surface is suppressed as a matter of course.

In each of the above-described embodiments, one chip is accommodated in one semiconductor package. However, the embodiments are not limited to this example. For example, the case in which two or more chips are packaged is also applicable. In many cases, two chips, for instance, an IGBT and a diode, are used as a set. Like a semiconductor package 7 illustrated in FIG. 22, the case of a two-chip structure is applicable. In the fabrication steps of the semiconductor package 7 of the two-chip structure using, for example, an IGBT and a diode, the IGBT and diode are disposed in openings in the frame 16. For example, a necessary wiring connection, such as a connection between the drain electrode of the IGBT and one surface of the diode, is made when rewirings are formed by plating. The two chips are regarded as a single package and are singulated at the time of the dicing of the final step. Thus, a single functional package is obtained. This contributes to reduction in number of steps relating to mounting on the board, and an improvement of productivity, and a decrease in electrical resistance between chips and enhancement of reliability can be expected.

Fifth Embodiment

Next, a semiconductor package 7 according to a fifth embodiment is described with reference to FIG. 23 to FIG.

25. In this embodiment, the drain electrode on the first surface side is a first chip electrode 12, the source electrode on the second surface side is a second chip 14, and the gate electrode on the second surface side is a third chip electrode 13. In the structure of this embodiment, the source electrode and the gate electrode are wired to the opposite side via rewirings 17A and 17B and an electrically conductive frame 16, the surface on the drain electrode side is directly mounted, and rewiring electrodes 18 and 19 are omitted. In the other respects, the fifth embodiment is the same as the first embodiment, and a description of common parts is omitted.

FIG. 23 is a cross-sectional view which schematically illustrates the semiconductor package 7 according to the present embodiment, FIG. 24 is a plan view schematically illustrating the semiconductor package 7, and FIG. 25 is a bottom view schematically illustrating the semiconductor package 7. The semiconductor package 7 includes a semiconductor chip 10 having chip electrodes 12, 13 and 14 on both sides thereof; an electrically conductive frame 16 surrounding the semiconductor chip 10; an insulation side portion 15 provided between the semiconductor chip 10 and the conductive frame 16; a plurality of rewirings 17A and 17B formed by plating on the front surface side of the semiconductor chip 10; an electrode insulation portion 21e which insulates the rewirings 17A and 17B from each other; and an insulation film 24 covering the back surface side of the semiconductor package 7.

The conductive frame 16, like the above-described first embodiment, is formed of an electrically conductive material such as Cu. The conductive frame 16 is in contact with the outside of the insulation side portion 15 which covers the side surfaces of the semiconductor chip 10, and the conductive frame 16 surrounds the outer periphery of the insulation side portion 15. As illustrated in FIG. 24, the conductive frame 16 is configured to include a frame portion 16A which is connected to the source electrode, and a frame portion 16B which is connected to the gate electrode. The frame portion 16A and frame portion 16B are insulated by the insulation side portion 15.

The insulation side portion 15 is formed by sealing with an insulation resin between the conductive frame 16 and the side wall of the semiconductor chip 10, and the insulation side portion 15 serves to effect electrical insulation between the conductive frame 16 and the semiconductor chip 10 and between the frame portions 16A and 16B. The insulation side portion 15 covers, with the insulation material, the entire periphery of the side surfaces of the semiconductor chip 10, and extends between the frame portions 16A and 16B. The insulation side portion 15 also functions to mechanically fix (connect) the chip and the frame.

The rewirings 17A and 17B, like the rewiring 17 of the first embodiment, are formed of, e.g. Cu plating films. The rewiring 17A is formed at predetermined locations on the surface of the second chip electrode 14 of the semiconductor chip 10 and on the surface of the insulation side portion 15. The second chip electrode 14 of the semiconductor chip 10 and the conductive frame 16, which is disposed on the side surface of the semiconductor chip 10, are mechanically and electrically connected via the rewiring 17A.

The rewiring 17B is formed at predetermined locations on the surface of the third chip electrode 13 of the semiconductor chip 10 and on the surface of the insulation side portion 15. The third chip electrode 13 of the semiconductor chip 10 and the conductive frame 16, which is disposed on the side surface of the semiconductor chip 10, are mechanically and electrically connected via the rewiring 17B.

The electrode insulation portion 21e is formed of, e.g. the same insulation resin as the insulation side portion 15, and insulates the rewirings 17A and 17B from each other. In the meantime, this electrode insulation portion 21e is not indispensable in the present embodiment, and may be omitted in this structure.

The semiconductor package 7 with the above-described structure is configured such that the semiconductor chip 10 having the electrodes on the front side 1a and back side 1b is the object, and the external electrodes of the semiconductor package 7 can be put together on one side. Thus, this semiconductor package 7 is configured as a surface mount type (one-side mount structure) semiconductor package 7, which can be connected to a mount board 31 via the external electrodes which are aggregated on one side, i.e. the front side 1a of the semiconductor package 7, and can be mounted on the board by the same connection method as with surface mount components by using various electrically conductive connection members 33 such as solders or conductive pastes.

An electric conduction path of each of the second chip electrode 14 (source) and the third chip electrode 13 (gate) is formed in a horizontal direction (X direction) by the rewiring 17A, 17B formed on the electrode surface thereof, and is formed in a vertical direction (Z direction) by the conductive frame 16A, 16B disposed on the side surface of the semiconductor chip 10. Each of the second chip electrode 14 (source) and the third chip electrode 13 (gate) is electrically connected to the board via a connection material 33 such as solder.

In addition, the first chip electrode 12 (drain) is directly electrically connected to a board electrode 32 of the mount board 31 via a connection material 33 such as solder.

Next, a method of manufacturing the semiconductor package 7 according to the embodiment is described with reference to FIG. 26 to FIG. 28. In this assembly process, fan-out for electrodes of a singulated semiconductor chip 10 is implemented by rewiring using plating, thereby extending wiring from the second surface, or the other side of the semiconductor chip 10, toward the first surface, or one side of the semiconductor chip 10, and putting together external electrodes on one side of the semiconductor package 7. In the process illustrated, the step of inversion and the step of forming a rewiring electrode are omitted. Details of each of the other common steps are the same as in the above-described first embodiment, and a detailed description is omitted.

Figure 26:
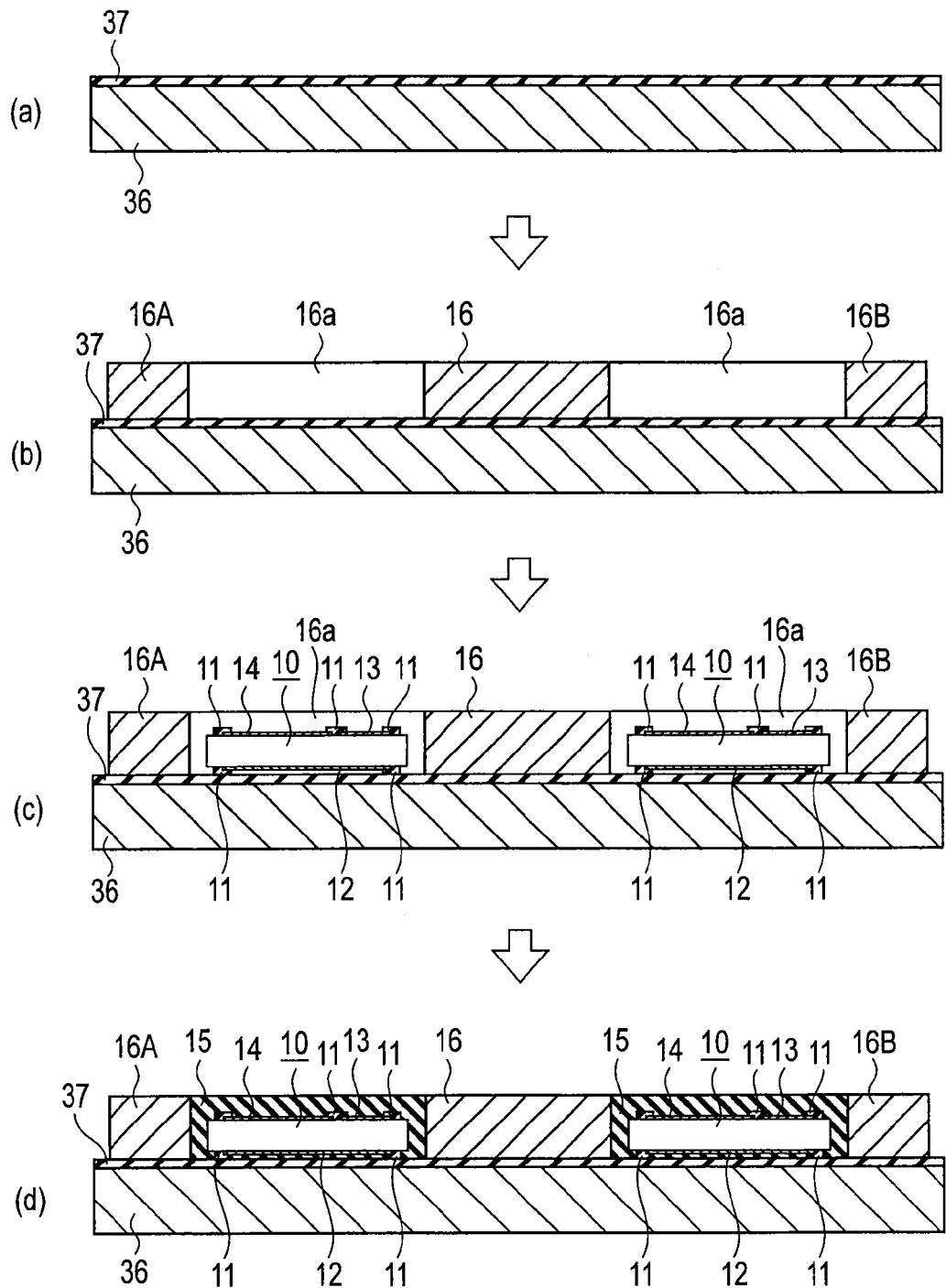
FIG. 26 is an explanatory view illustrating a manufacturing method of the semiconductor package.

To start with, as illustrated in part (a) of FIG. 26, a provisional fixing material 37, which is re-peelable, is disposed on a substrate 36.

Then, as shown in part (b) of FIG. 26, an electrically conductive frame 16 is disposed and fixed on the provisional fixing material 37. The conductive frame 16 includes frames 16A and 16B as one body, which are to be separated from each other when singulation is performed, and includes openings 16a in which semiconductor chips 10 are disposed.

Subsequently, as illustrated in part (c) of FIG. 26, semiconductor chips 10 are disposed in the openings 16a of the conductive frame 16. In this step, the semiconductor chips 10 are mounted such that the chip electrode 12, which is the drain electrode, is positioned on the lower side.

Then, as illustrated in part (d) of FIG. 26, an insulation material is filled, the semiconductor chips 10 are sealed, and the side surfaces and front surfaces of the semiconductor chips 10 are sealed with insulation resin.

Figure 27:
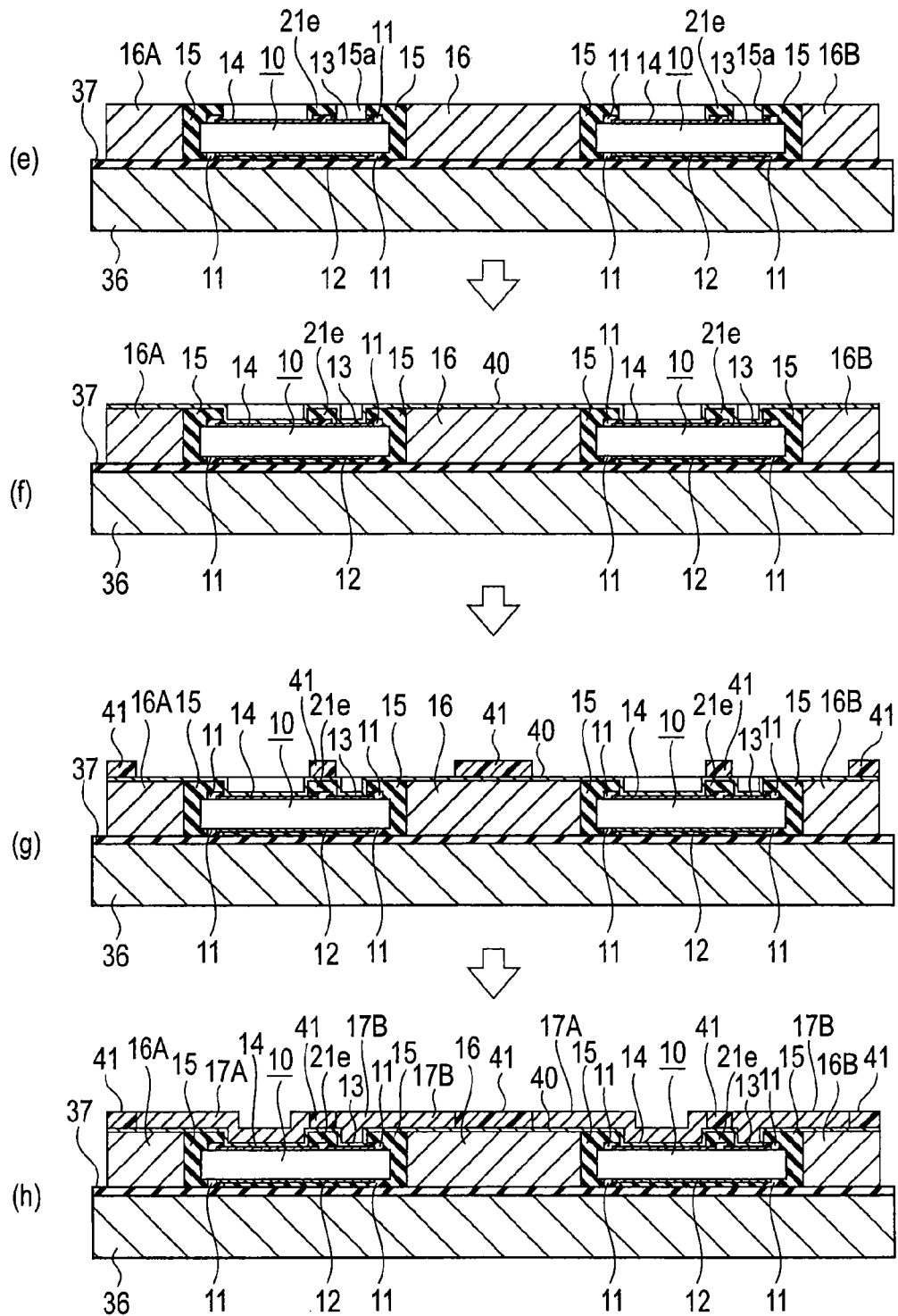
FIG. 27 is an explanatory view illustrating the manufacturing method of the semiconductor package.

Next, as illustrated in part (e) of FIG. 27, openings are formed in the insulation sealing material, and chip electrodes 13 and 14 are exposed. By the above steps, openings 15a of a predetermined shape, which surround the peripheries of the semiconductor chips 10 and expose the chip electrodes 13 and 14, are formed, and the insulation side portions 15 are formed. Incidentally, as regards the details of the step of forming the insulation side portions 15, like the first embodiment, the method 1 to method 5 shown in FIG. 13A to FIG. 13E can be used. In this embodiment, the insulation material is filled in part (d) of FIG. 27, and openings are formed in part (e) of FIG. 27. However, at the time of filling, if printing is performed by patterning the surface with a screen mask, etc., the step of part (e) of FIG. 27 can be omitted.

After the insulation side portion 15 is formed or at the same time as the formation of the insulation side portion 15, the electrode insulation portion 21e is formed by forming an insulation resin (corresponding to a solder resist) by PEP or printing. The electrode insulation portion 21e functions to ensure insulation when the rewirings 17A and 17B are formed by plating at the parts of the third chip electrode 13 and second chip electrode 14 of the semiconductor chip 10, and is patterned in accordance with the design of the semiconductor package 7.

Subsequently, as illustrated in part (f) of FIG. 27, a seed layer 40, which becomes an underlayer when the rewirings 17A and 17B are formed, is formed (Ti/Cu sputter). In this step, the seed layer 40 of Ti/Cu is formed by sputtering over the entirety of one-side surface of the semiconductor chip 10, conductive frame 16, electrode insulation portion 21e and the insulation resin.

Further, as illustrated in part (g) of FIG. 27, a resist 41 is coated on the seed layer 40 and is patterned. In this step, patterning of rewirings 17A and 17B on the front surface side (gate and source electrodes) of the semiconductor chip 10 is performed. The resist 41 is not indispensable in this embodiment, and may be omitted.

Next, as illustrated in part (h) of FIG. 27, a plating film is formed on predetermined areas and thereby rewirings 17A and 17B, which are connected to the source electrode and gate electrode, are formed. This step is the same as the plating step in the first embodiment, and for example, Cu plating films are formed. In the meantime, the Cu of the seed layer 40 and the Cu plating film form a metallic bond, and, as a result, the seed layer 40 and the plating film are combined to provide the rewiring structure of Ti/Cu. In the Figures, excluding the Figure illustrating the step of forming the seed layer 40, depiction of the seed layer 40 is omitted where necessary.

Next, as illustrated in part (i) of FIG. 28, the resist 41, which was used as the mask of the plating film, is peeled, and the seed layer 40 is etched away. This step, too, is the same as the resist peeling step in the above-described first embodiment.

Subsequently, as illustrated in part (j) of FIG. 28, an insulation film 24 is formed on the surface including the conductive frame 16, rewirings 17A and 17B, and electrode insulation portion 21e.

Next, as illustrated in part (k) of FIG. 28, the board 36 is peeled, and singulation by dicing is performed. In this step, the board 36, which is attached to the back surface of the semiconductor package 7, is first peeled and, instead, a dicing sheet 46 is attached, and dicing using a dicing blade 47 is performed.

After singulation, the dicing sheet 46 is peeled. A characteristic test of each semiconductor package 7, marking on the back surface of the semiconductor package 7 and packing in a reel or the like are performed, and the semiconductor package 7 is completed.

The semiconductor package 7 after singulation can be bonded to the board, like surface mount components, as shown in FIG. 23. By the drain electrode and the frame portions 16A and 16B of conductive frame 16 which become the external electrodes aggregated on one side of the semiconductor package 1, the semiconductor package 7 is mechanically and electrically connected via a land pattern formed on the mount board 31 and bonding materials 33 such as solder, Ag paste and Cu paste. As regards concrete bonding methods, like surface mount components, the semiconductor package 7 is bonded by solder paste coating, component mounting, and batch bonding by reflow.

With the semiconductor package 7 according to the present embodiment and the manufacturing method of the semiconductor package 7, the same advantageous effects as in the first embodiment can be obtained. Furthermore, since the chip electrode 14 on the first surface side and the frame portions 16A and 16B are disposed on the same surface side and can be used as the external electrodes as such, the rewiring electrodes 18, 19 and 20 can be omitted, and the structure and the manufacturing process can be simplified.

In the meantime, as another embodiment, the case in which the chip 10 is inverted in the semiconductor package 7 is applicable. Specifically, in the semiconductor package 1 according to the first embodiment, the rewiring electrodes 18, 19 and 20 may be omitted, the rewiring 17 which establishes electrical connection between the drain electrode and the conductive frame 16 may be formed, and the conductive frame 16, source electrode 12 and gate electrode 13 may be configured as external electrodes and may be directly mounted on the mount board. In addition, in the semiconductor package 2 of the second embodiment, the rewiring electrodes 18 and 20, which become the external electrodes, may be omitted, and the chip electrode 12 and conductive frame 16 may be configured as external electrodes and may be directly mounted on the mount board. Furthermore, in the semiconductor package 3 according to the third embodiment, the rewiring electrodes 18, 62 and 19, which become the external electrodes, may be omitted, and the chip electrodes 12, 61 and 13 may be configured as external electrodes and may be directly mounted on the mount board.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a chip including a first chip electrode on a first surface on one side, and a second chip electrode on a second surface on an other side;
    an electrically conductive frame provided on a side periphery of the chip;
    a rewiring configured to electrically connect the second chip electrode and the electrically conductive frame on the other side of the chip; and
    an insulation side portion provided between the electrically conductive frame and the side periphery of the chip,
    wherein an electrical connection from the one side to the second chip electrode is enabled via the electrically conductive frame and the rewiring.

2. The semiconductor device of claim 1, wherein
    the semiconductor device is configured as a semiconductor package device, a third chip electrode is formed on the second surface of the chip, and the semiconductor package device includes:

a rewiring configured to electrically connect the third chip electrode and the electrically conductive frame on the other side of the chip; and an insulation portion provided between a rewiring of the second chip electrode and a rewiring of the third chip electrode, each of the first to third chip electrodes is any one of a source, a gate and a drain, and an electrical connection to the first to third chip electrodes is enabled from the one side.

3. The semiconductor device of claim 1, wherein the rewiring is formed of a plating film.

4. The semiconductor device of claim 1, wherein the first chip electrode and a part on one side of the electrically conductive frame constitute an external electrode.

5. The semiconductor device of claim 1, further comprising:

a third chip electrode is formed on the first surface of the chip, wherein an insulation portion is formed between the first chip electrode and the third chip electrode.

6. The semiconductor device of claim 1, wherein the rewiring is directly connected to the insulation side portion.

7. A semiconductor device comprising:

a chip including a first chip electrode on a first surface on one side, and a second chip electrode on a second surface on an other side;

an electrically conductive frame provided on a side periphery of the chip;

a rewiring configured to electrically connect the second chip electrode and the electrically conductive frame on the other side of the chip;

an insulation side portion provided between the electrically conductive frame and the side periphery of the chip;

a first rewiring electrode which is electrically connected to the first chip electrode on the one side of the chip and constitutes a first external electrode;

a second rewiring electrode which is electrically connected to the electrically conductive frame on the one side of the chip and constitutes a second external electrode; and an electrode insulation portion configured to mutually insulate a plurality of said rewiring electrodes on the one side of the chip, wherein an electrical connection to the first chip electrode is enabled from the one side via the first rewiring electrode, and an electrical connection to the second chip electrode is enabled from the one side via the second rewiring electrode, the electrically conductive frame and the rewiring.

8. The semiconductor device of claim 7, wherein at least any one of the rewiring and the rewiring electrodes includes at least two layers, and at least one of the at least two layers includes a seed layer which becomes an adhesive layer.

9. The semiconductor device of claim 7, wherein an insulation film is formed on at least either a part of the first surface on the one side, which avoids the rewiring electrodes, or the second surface on the other side.

10. A semiconductor device comprising:

a chip including a first chip electrode on a first surface on one side, and a second chip electrode on a second surface on an other side;

an electrically conductive frame provided on a side periphery of the chip;

a rewiring configured to electrically connect the second chip electrode and the electrically conductive frame on the other side of the chip; and an insulation side portion provided between the electrically conductive frame and the side periphery of the chip, wherein the semiconductor device is configured as a semiconductor package device, a third chip electrode is formed on the first surface of the chip, the semiconductor package device includes a rewiring electrode which is electrically connected to the third chip electrode on the one side of the chip and constitutes an external electrode, each of the first to third chip electrodes is any one of a source, a gate and a drain, and an electrical connection to the first to third chip electrodes is enabled from the one side.

11. The semiconductor device of claim 10, wherein the electrically conductive frame includes a first frame portion which is connected to the second chip electrode via the rewiring, and a second frame portion which is connected to the third chip electrode via the rewiring, and the first frame portion and the second frame portion are insulated from each other.

12. A semiconductor device comprising:

a chip including a first chip electrode on a first surface on one side, and a second chip electrode on a second surface on an other side;

an electrically conductive frame provided on a side periphery of the chip;

a rewiring configured to electrically connect the second chip electrode and the electrically conductive frame on the other side of the chip; and an insulation side portion provided between the electrically conductive frame and the side periphery of the chip, wherein an electrically conductor member, which is electrically connected to the second chip electrode, is provided on the second surface on the other side of the chip, the rewiring is formed on a surface on an other side of the electrically conductive member, and the electrically conductive frame and the rewiring are electrically connected via the electrically conductive member.

* * * * *